United States Patent
Sakai et al.

(10) Patent No.: US 12,277,980 B2
(45) Date of Patent: *Apr. 15, 2025

(54) SEMICONDUCTOR STORAGE DEVICE

(71) Applicant: SOCIONEXT INC., Kanagawa (JP)

(72) Inventors: Yasumitsu Sakai, Kanagawa (JP); Shinichi Moriwaki, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,722

(22) Filed: Dec. 13, 2023

(65) Prior Publication Data
US 2024/0112746 A1    Apr. 4, 2024

Related U.S. Application Data

(63) Continuation of application No. 17/524,535, filed on Nov. 11, 2021, now Pat. No. 11,881,273, which is a (Continued)

(30) Foreign Application Priority Data

May 13, 2019   (JP) ................................. 2019-090697

(51) Int. Cl.
*G11C 11/34* (2006.01)
*G11C 5/06* (2006.01)
(Continued)

(52) U.S. Cl.
CPC .............. *G11C 17/12* (2013.01); *G11C 5/063* (2013.01); *G11C 11/4074* (2013.01); *G11C 11/4085* (2013.01); *G11C 11/4094* (2013.01)

(58) Field of Classification Search
CPC .......................... H01L 27/114; H01L 25/11521
(Continued)

(56) References Cited

U.S. PATENT DOCUMENTS 7,339,186 B2 *  3/2008  Mio ...................... H01L 29/73
                                                     257/E29.174
7,715,246 B1    5/2010  Kim
(Continued)

FOREIGN PATENT DOCUMENTS

JP          2011-258898 A    12/2011

OTHER PUBLICATIONS

J. Ryckaert et al., "The Complementary FET (CFET) for CMOS scaling beyond N3," 2018 Symposium on VLSI Technology Digest of Technical Papers, pp. 141-142 (cited in Specification).
(Continued)

*Primary Examiner* — Son T Dinh
(74) *Attorney, Agent, or Firm* — Rimon P.C.

(57) ABSTRACT

A layout structure of a ROM cell using a complementary FET (CFET) is provided. The ROM cell includes first and second three-dimensional transistors. The second transistor is formed above the first transistor, and the channel portions of the first and second transistors overlap each other. First data is stored in the ROM cell depending on the presence or absence of connection between a local interconnect connected to the source of the first transistor and a ground power supply line, and second data is stored in the ROM cell depending on the presence or absence of connection between a local interconnect connected to the source of the second transistor and a ground power supply line.

9 Claims, 38 Drawing Sheets

Related U.S. Application Data continuation of application No. PCT/JP2020/018392, filed on May 1, 2020.

(51) Int. Cl.
| | |
|---|---|
| *G11C 11/4074* | (2006.01) |
| *G11C 11/408* | (2006.01) |
| *G11C 11/4094* | (2006.01) |
| *G11C 17/12* | (2006.01) |

(58) Field of Classification Search
USPC .................................................. 365/185.05
See application file for complete search history.

(56) References Cited

U.S. PATENT DOCUMENTS

| | | | |
|---|---|---|---|
| 9,240,221 B2 | 1/2016 | Terada et al. | |
| 9,361,981 B2 | 6/2016 | El-Kareh et al. | |
| 11,881,273 B2 * | 1/2024 | Sakai .................... | H10B 20/50 |
| 2016/0329313 A1 | 11/2016 | Kawa et al. | |
| 2018/0151576 A1 | 5/2018 | Lee | |

OTHER PUBLICATIONS

A. Mocuta et al., "Enabling CMOS Scaling Towards 3nm and Beyond," 2018 Symposium on VLSI Technology Digest of Technical Papers, pp. 147-148 (cited in Specification).
International Search Report and Written Opinion issued in corresponding International Patent Application No. PCT/JP2020/018392, dated Jun. 30, 2020, with partial English translation.
Notice of Allowance dated Sep. 14, 2023 issued in U.S. Appl. No. 17/524,535.

* cited by examiner

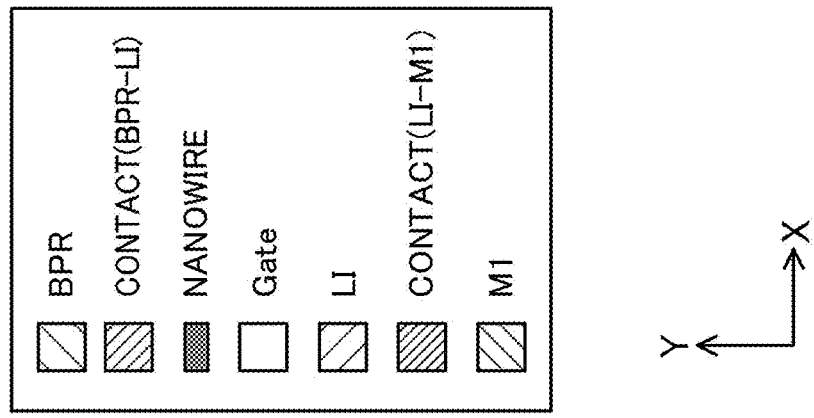
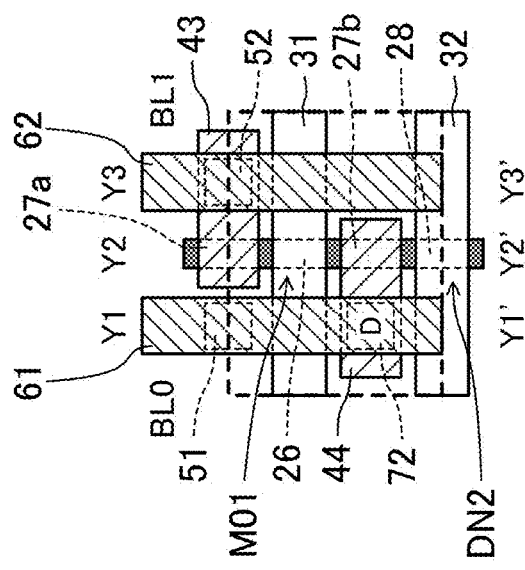
FIG.2A
UPPER PART(Nch)
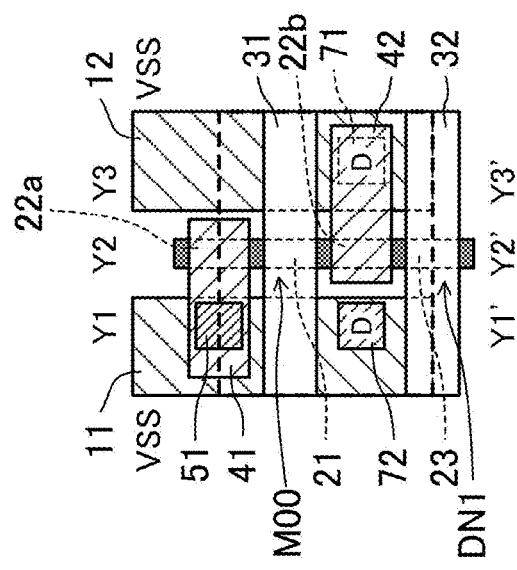
FIG.2B
LOWER PART(Nch)

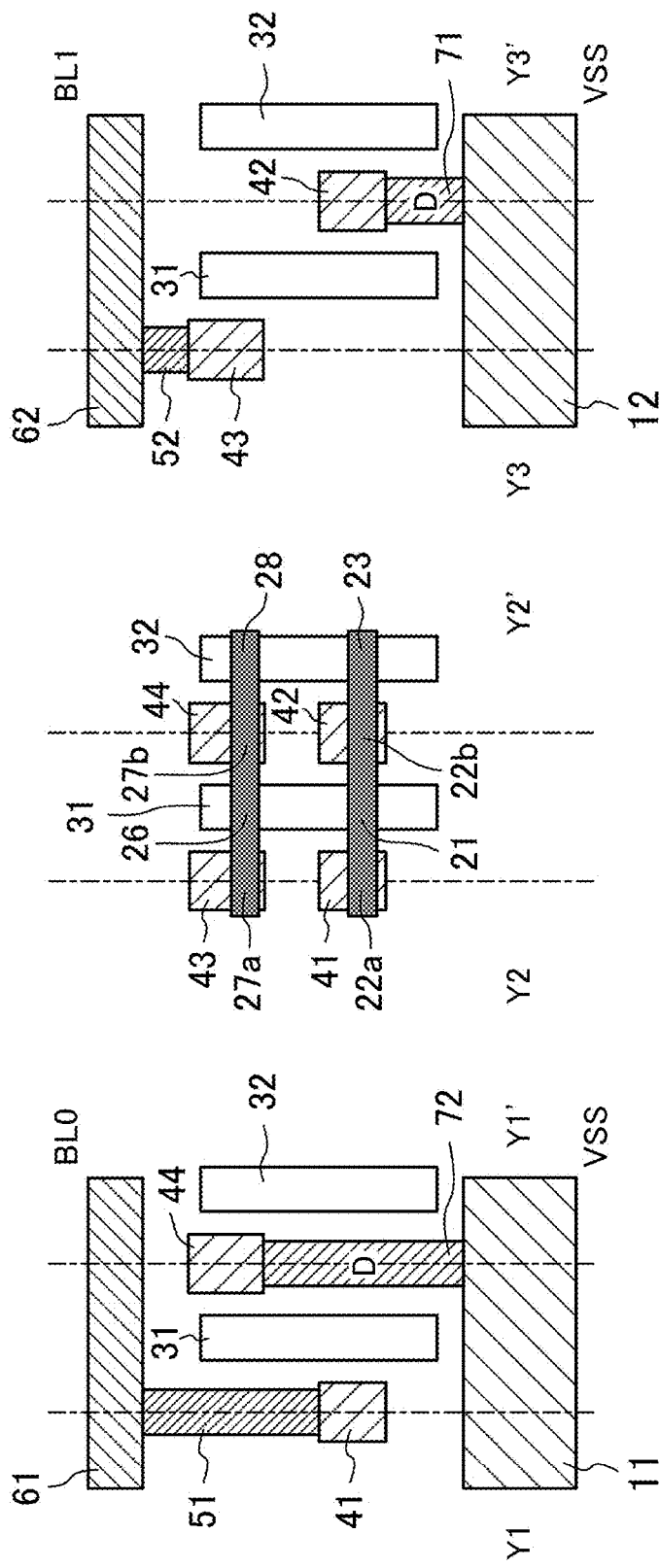

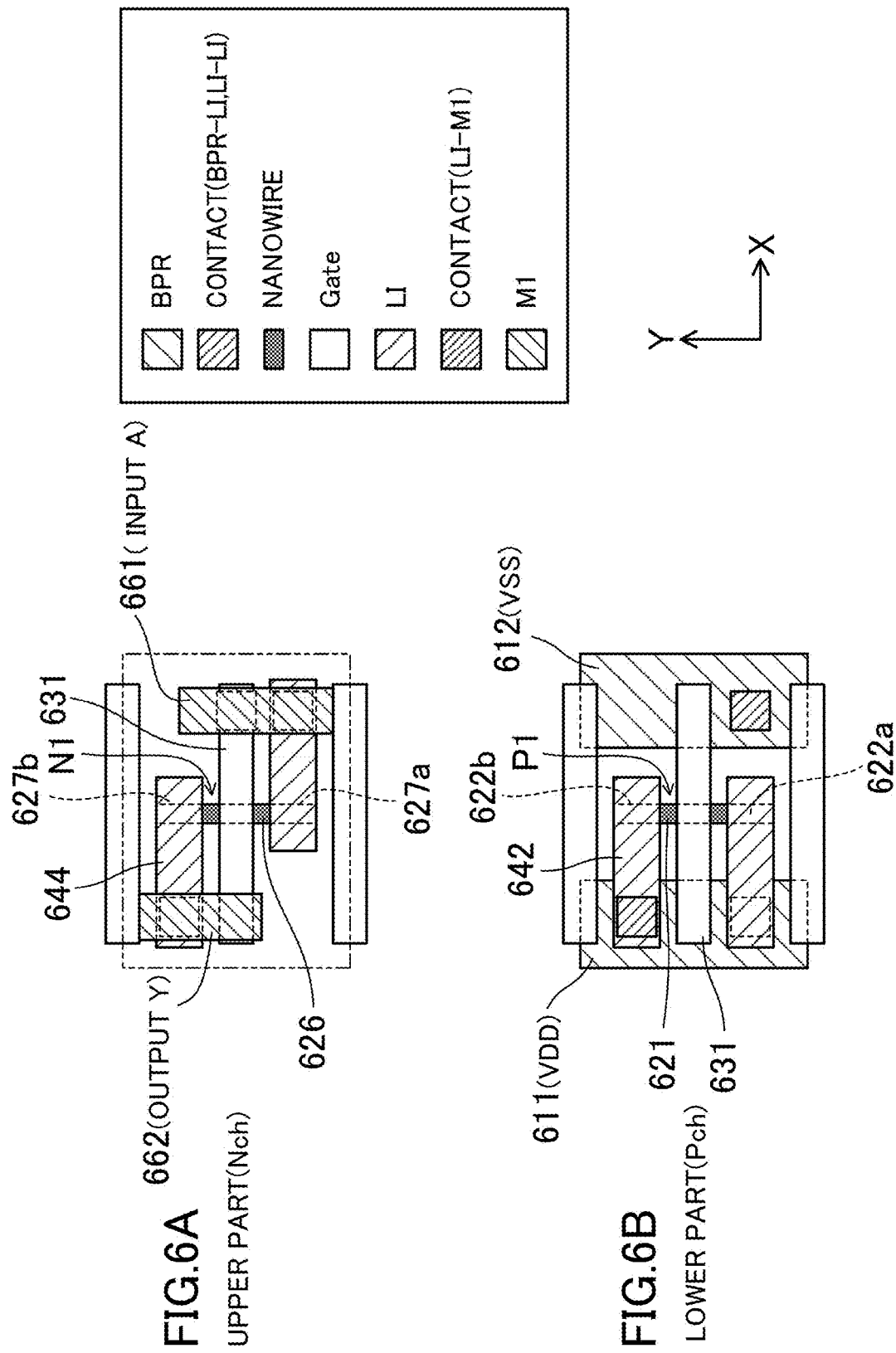

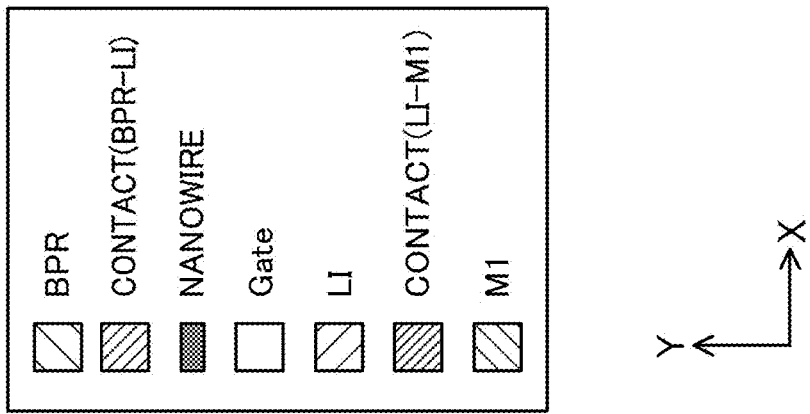
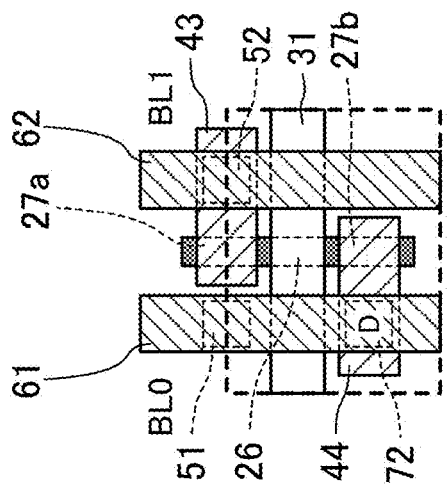
FIG.7A
UPPER PART(Nch)
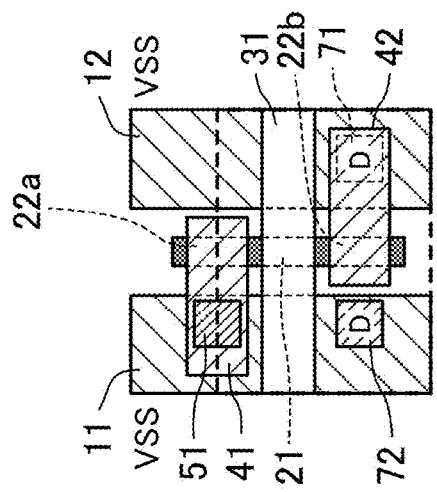
FIG.7B
LOWER PART(Nch)

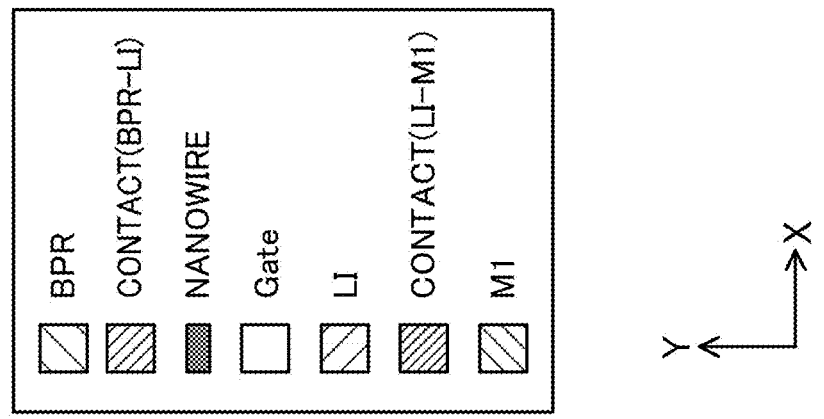
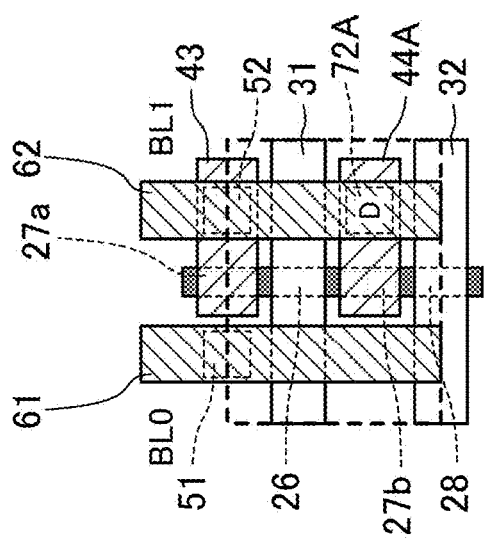
FIG.8A
UPPER PART(Nch)
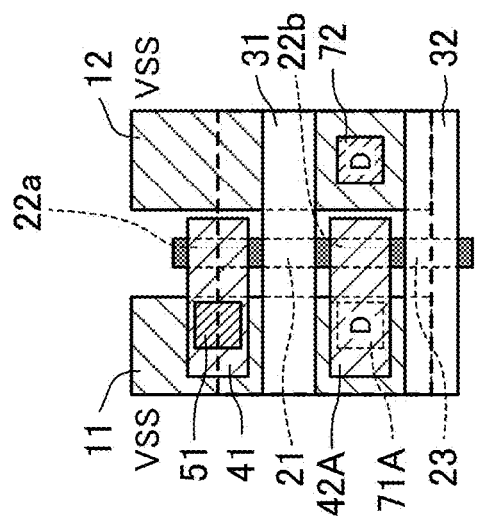
FIG.8B
LOWER PART(Nch)

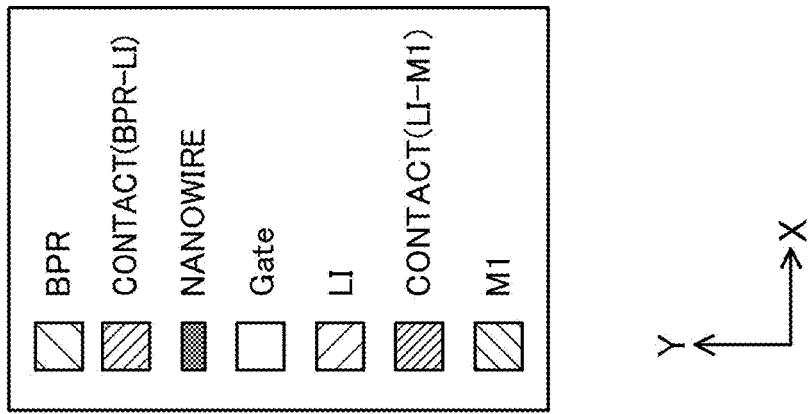
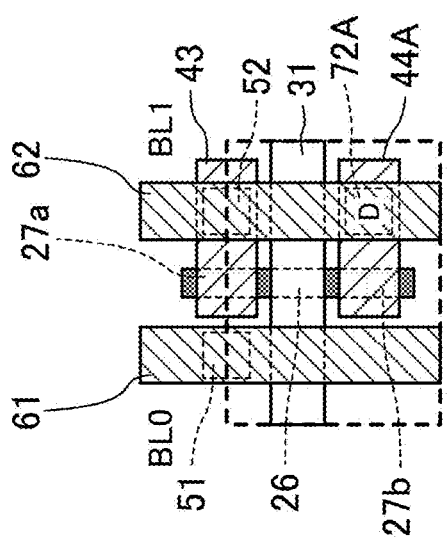
FIG.9A
UPPER PART(Nch)
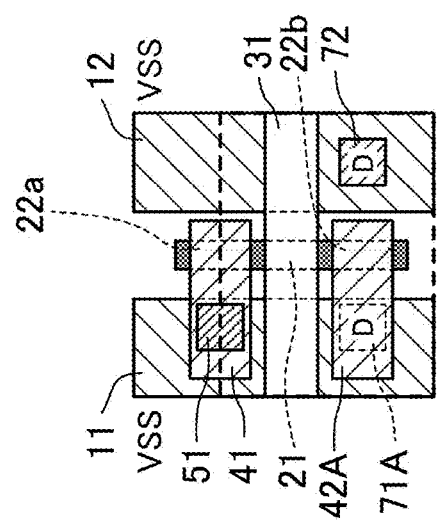
FIG.9B
LOWER PART(Nch)

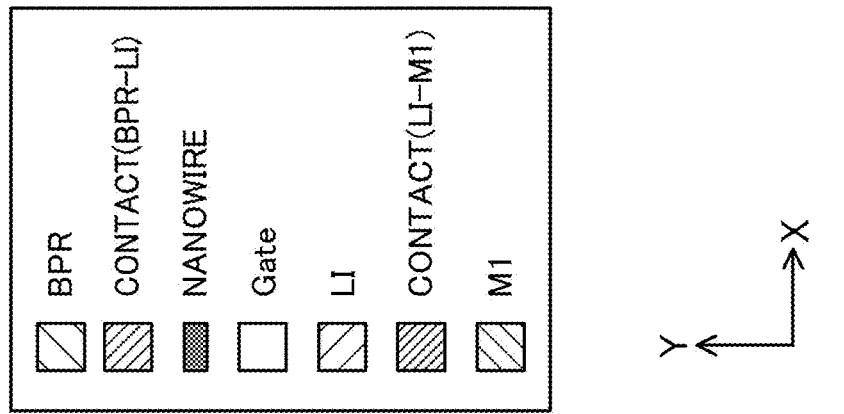
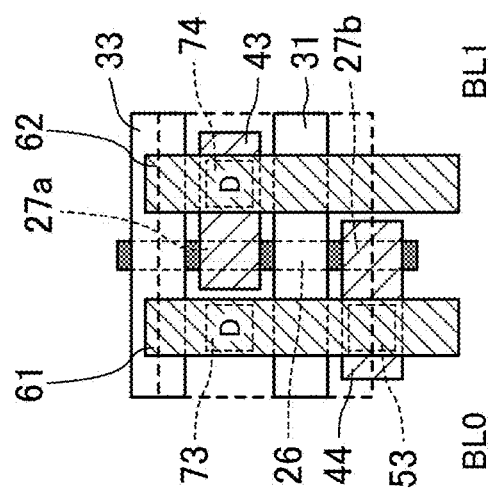
FIG.10A
UPPER PART(Nch)
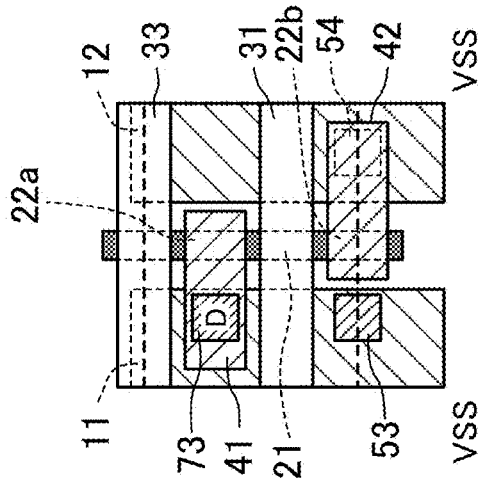
FIG.10B
LOWER PART(Nch)

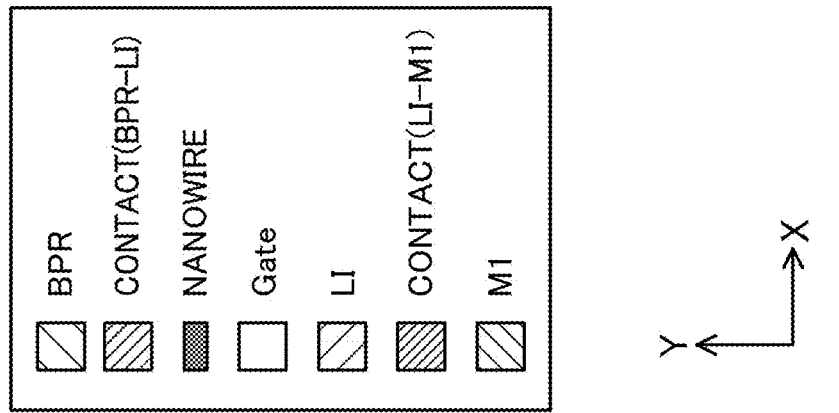
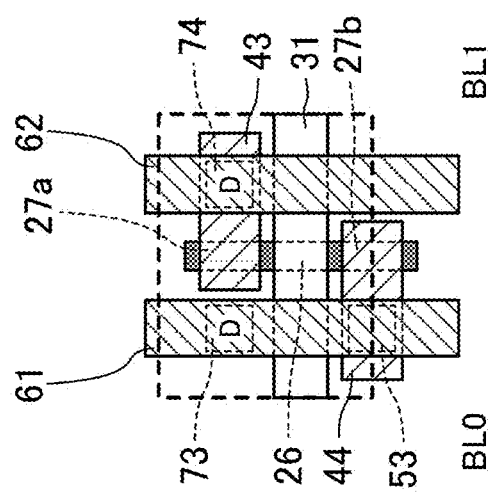
FIG.13A
UPPER PART(Nch)
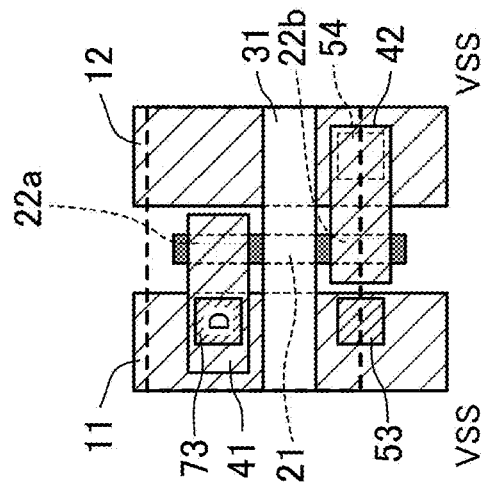
FIG.13B
LOWER PART(Nch)

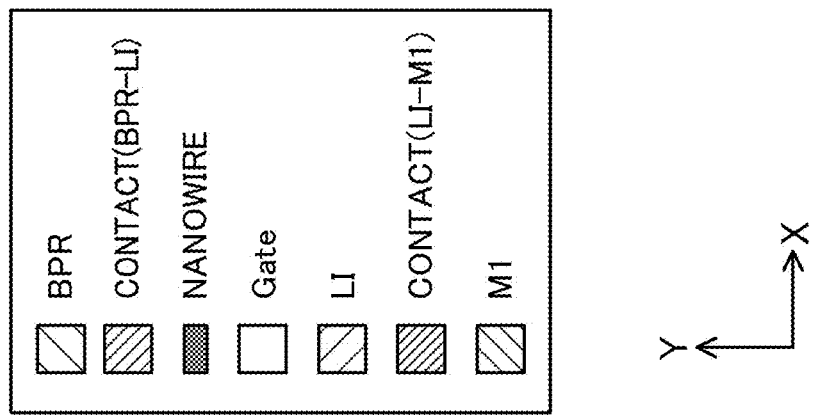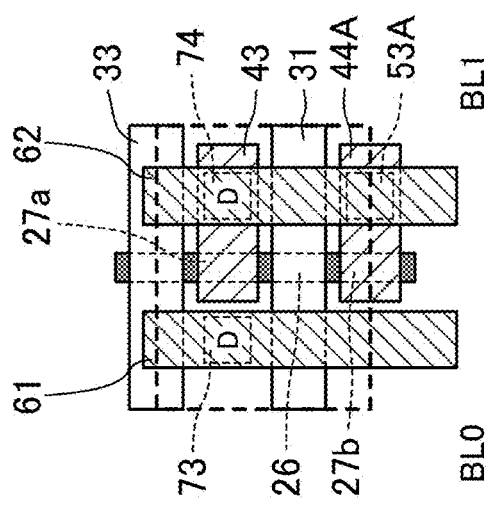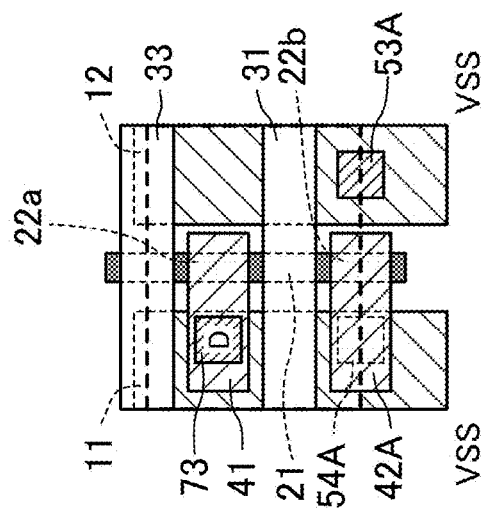
FIG.14A UPPER PART(Nch)
FIG.14B LOWER PART(Nch)

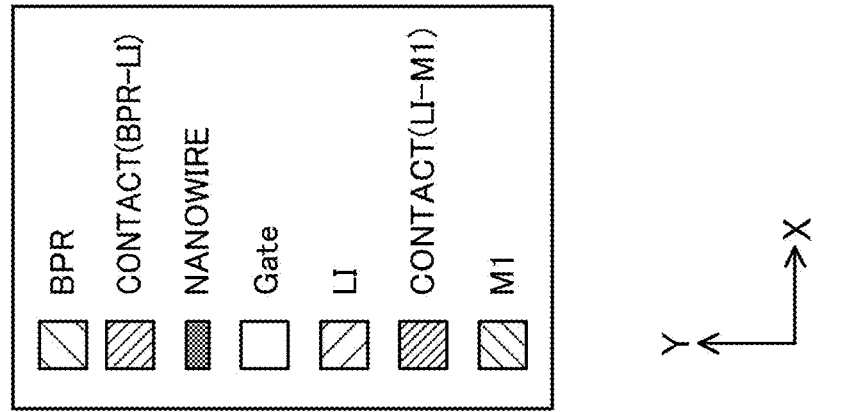
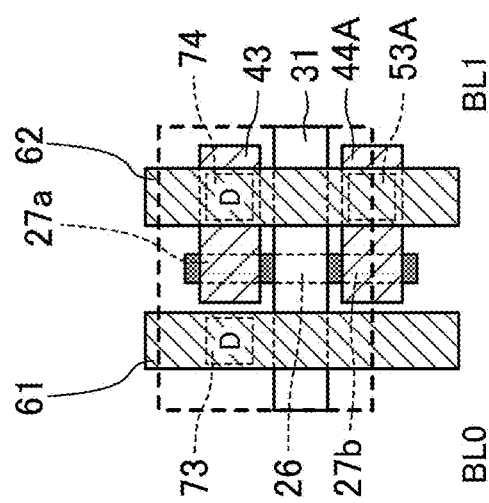
FIG.15A
UPPER PART(Nch)
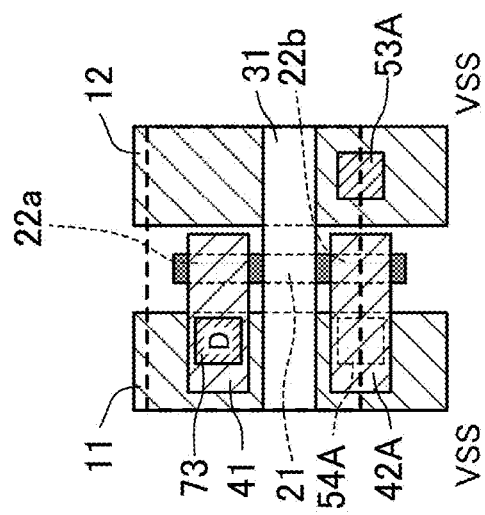
FIG.15B
LOWER PART(Nch)

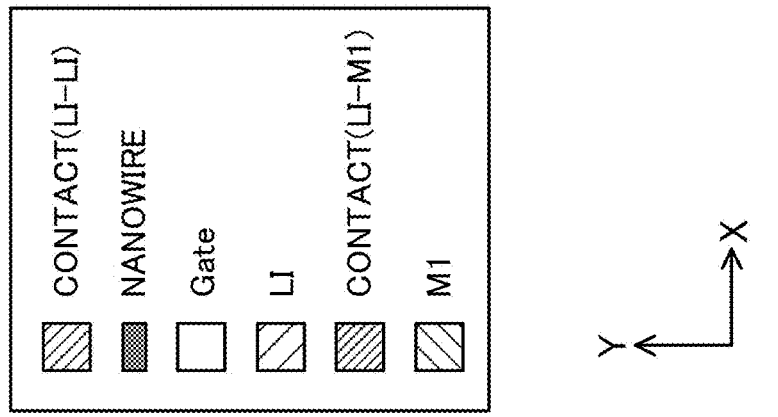
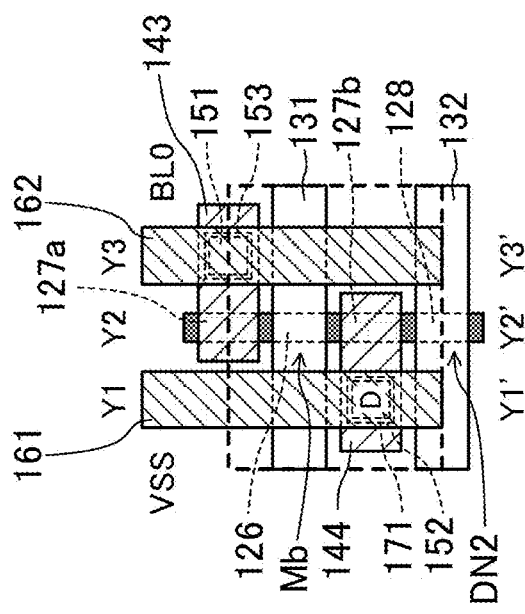
FIG.16A
UPPER PART(Nch)
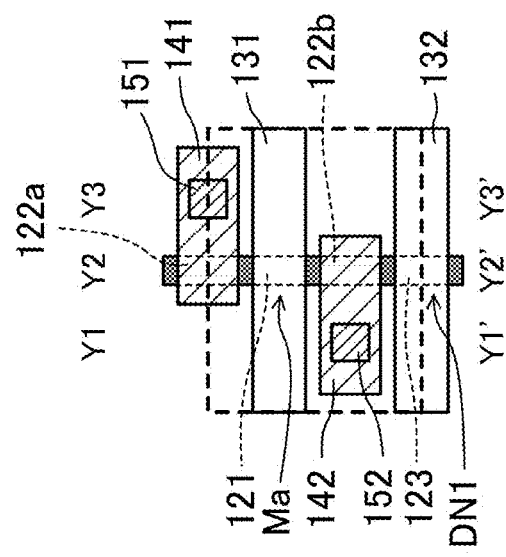
FIG.16B
LOWER PART(Nch)

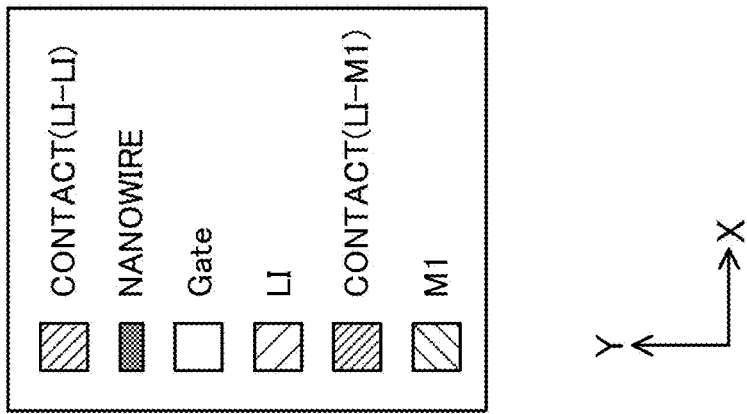
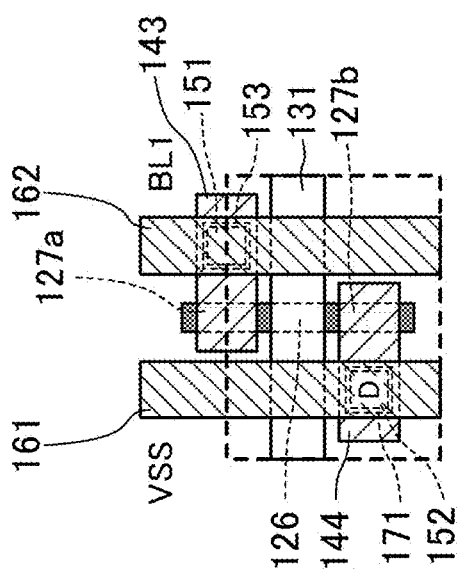
FIG.20A
UPPER PART(Nch)
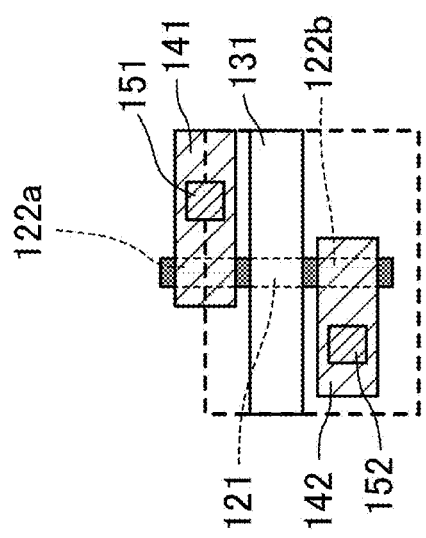
FIG.20B
LOWER PART(Nch)

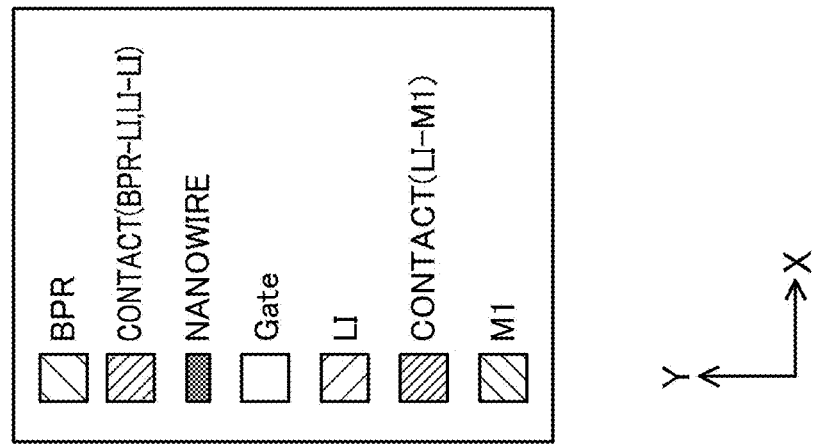
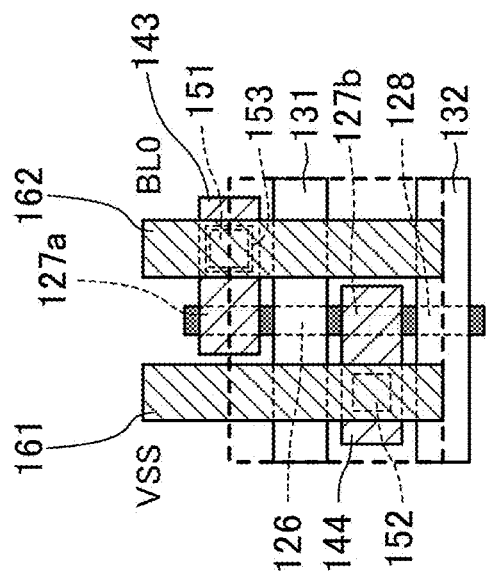
FIG.21A
UPPER PART(Nch)
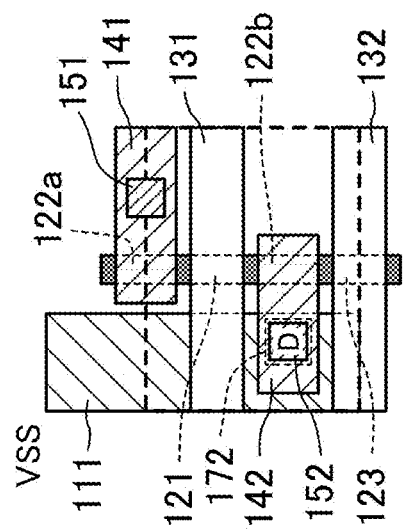
FIG.21B
LOWER PART(Nch)

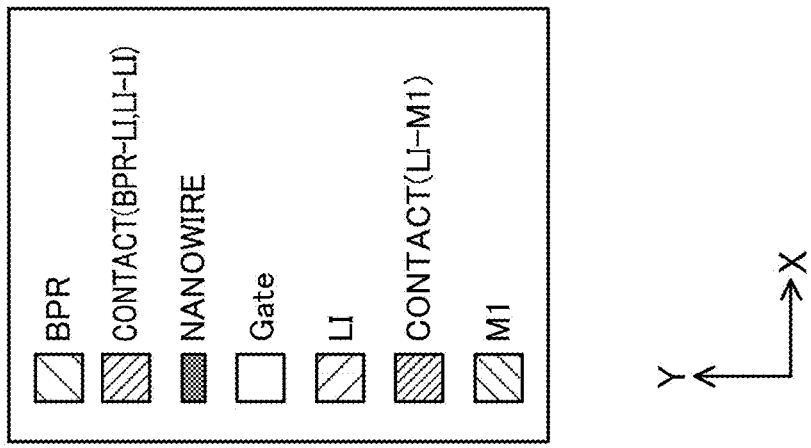
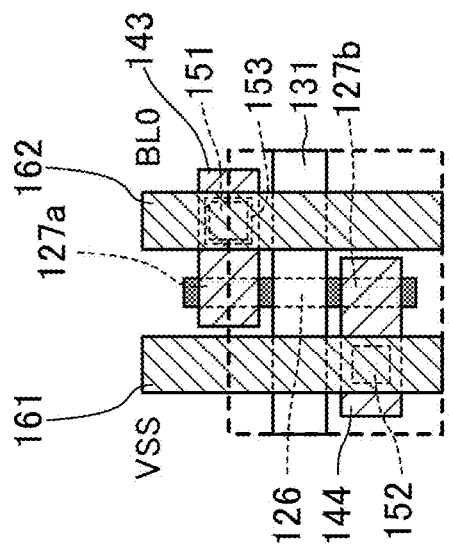
FIG.22A
UPPER PART(Nch)
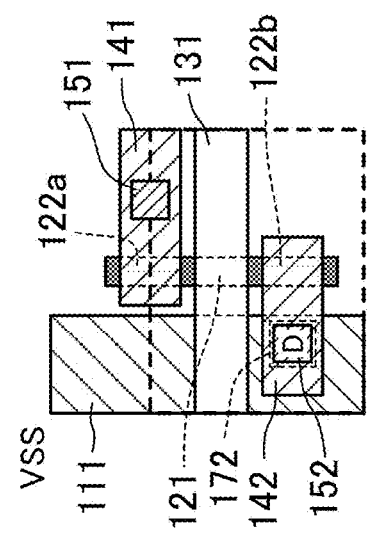
FIG.22B
LOWER PART(Nch)

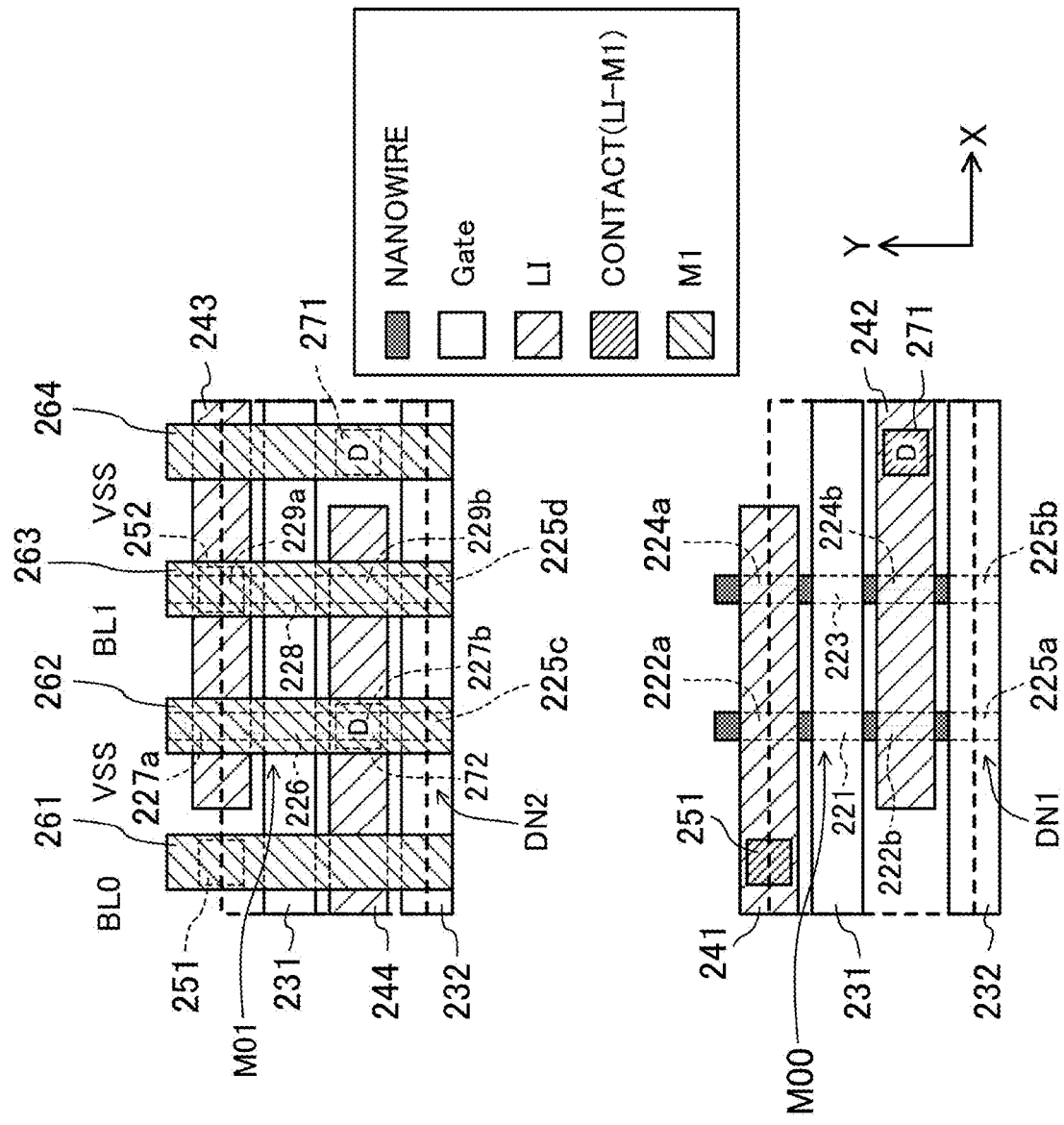

FIG.27A UPPER PART(Nch)

FIG.27B LOWER PART(Nch)

FIG.28A UPPER PART(Nch)

FIG.28B LOWER PART(Nch)

FIG.34A UPPER PART(Nch)

FIG.34B LOWER PART(Nch)

SEMICONDUCTOR STORAGE DEVICE

CROSS-REFERENCE TO RELATED APPLICATIONS

This application is a continuation of U.S. patent application Ser. No. 17/524,535, dated Nov. 11, 2021, now U.S. Pat. No. 11,881,273, which is a continuation of International Application No. PCT/JP2020/018392 filed on May 1, 2020, which claims priority to Japanese Patent Application No. 2019-090697 filed on May 13, 2019. The entire disclosures of these applications are incorporated by reference herein.

BACKGROUND

The present disclosure relates to a semiconductor storage device using complementary FET (CFET) devices, and more particularly to a layout structure of a mask read only memory (ROM) using CFETs.

A mask ROM includes memory cells arranged in an array, and the memory cells are programmed to have their fixed data states during manufacture. A transistor constituting a memory cell is provided between a bit line and VSS and connected with a word line at its gate. Bit data "1" or "0" is stored in the memory cell depending on the presence or absence of connection between the source or the drain and the bit line or VSS. The presence or absence of connection is realized by the presence or absence of a contact or a via, for example.

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

Until now, however, no examination has been made on the layout structure of a mask ROM using CFETs.

An objective of the present disclosure is providing a layout structure of a mask ROM using CFETs.

SUMMARY

According to the first mode of the present disclosure, a semiconductor storage device provided with a read only memory (ROM) cell includes: a word line extending in a first direction; first and second bit lines extending in a second direction perpendicular to the first direction; and a ground power supply line extending in the second direction, wherein the ROM cell includes a first transistor that is a three-dimensional transistor provided between the first bit line and the ground power supply line, a second transistor that is a three-dimensional transistor provided between the second bit line and the ground power supply line, formed above the first transistor, channel portions of the first and second transistors overlapping each other as viewed in plan, a first local interconnect that is connected to a source of the first transistor and extends from the first transistor toward a first-oriented direction in the first direction, a second local interconnect that is connected to a source of the second transistor and extends from the second transistor toward a direction opposite to the first-oriented direction in the first direction, a third local interconnect that is connected to a drain of the first transistor and extends from the first transistor toward a second-oriented direction in the first direction, and a fourth local interconnect that is connected to a drain of the second transistor and extends from the second transistor toward a direction opposite to the second-oriented direction in the first direction, gates of the first and second transistors are connected to the word line, and first data is stored in the ROM cell depending on the presence or absence of connection between the first local interconnect and the ground power supply line or the presence or absence of connection between the third local interconnect and the first bit line, and second data is stored in the ROM cell depending on the presence or absence of connection between the second local interconnect and the ground power supply line or the presence or absence of connection between the fourth local interconnect and the second bit line.

According to the above mode, the ROM cell includes the first transistor that is a three-dimensional transistor provided between the first bit line and the ground power supply line and the second transistor that is a three-dimensional transistor provided between the second bit line and the ground power supply line. The second transistor is formed above the first transistor, and the channel portions of the first and second transistors overlap each other as viewed in plan. First data is stored in the ROM cell depending on the presence or absence of connection between the first local interconnect connected to the source of the first transistor and the ground power supply line, or the presence or absence of connection between the third local interconnect connected to the drain of the first transistor and the first bit line. Also, second data is stored in the ROM cell depending on the presence or absence of connection between the second local interconnect connected to the source of the second transistor and the ground power supply line, or the presence or absence of connection between the fourth local interconnect connected to the drain of the second transistor and the second bit line. With this configuration, a small-area layout structure of a mask ROM can be implemented.

According to the second mode of the present disclosure, a semiconductor storage device provided with a read only memory (ROM) cell includes: a word line extending in a first direction; a bit line extending in a second direction perpendicular to the first direction; and a ground power supply line extending in the second direction, wherein the ROM cell includes a first transistor that is a three-dimensional transistor provided between the bit line and the ground power supply line, a second transistor that is a three-dimensional transistor provided between the bit line and the ground power supply line, formed above the first transistor, channel portions of the first and second transistors overlapping each other as viewed in plan, a first local interconnect connected to a source of the first transistor, a second local interconnect connected to a source of the second transistor and also connected with the first local interconnect, a third local interconnect connected to a drain of the first transistor, a fourth local interconnect connected to a drain of the second transistor and also connected with the third local interconnect, gates of the first and second transistors are connected to the word line, and data is stored in the ROM cell depending on the presence or absence of connection between the first and second local interconnects and the ground power supply line or the presence or absence of connection between the third and fourth local interconnects and the bit line.

According to the above mode, the ROM cell includes the first and second transistors that are three-dimensional transistors provided between the bit line and the ground power supply line. The second transistor is formed above the first transistor, and the channel portions of the first and second transistors overlap each other as viewed in plan. The first local interconnect connected to the source of the first transistor and the second local interconnect connected to the source of the second transistor are mutually connected. The third local interconnect connected to the drain of the first transistor and the fourth local interconnect connected to the drain of the second transistor are mutually connected. Data is stored in the ROM cell depending on the presence or absence of connection between the first and second local interconnects and the ground power supply line, or the presence or absence of connection between the third and fourth local interconnects and the bit line. With this configuration, a small-area layout structure of a mask ROM can be implemented.

According to the third mode of the present disclosure, a semiconductor storage device provided with a read only memory (ROM) cell includes: a word line extending in a first direction; first and second bit lines extending in a second direction perpendicular to the first direction; and a ground power supply line extending in the second direction, wherein the ROM cell includes a first transistor that is a three-dimensional transistor provided between the first bit line and the ground power supply line, including two transistors lying side by side in the second direction and sharing a first node that is one of a source and a drain, a second transistor that is a three-dimensional transistor provided between the second bit line and the ground power supply line, including two transistors lying side by side in the second direction and sharing the first node, formed above the first transistor, channel portions of the first and second transistors overlapping each other as viewed in plan, a first local interconnect that is connected to the first node shared by the two transistors of the first transistor and extends toward a first-oriented direction in the first direction, a second local interconnect that is connected to the first node shared by the two transistors of the second transistor and extends toward a direction opposite to the first-oriented direction in the first direction, two third local interconnects that are each connected to a second node that is the other of the source and drain of each of the two transistors of the first transistor and extend toward a second-oriented direction in the first direction, and two fourth local interconnects that are each connected to a second node of each of the two transistors of the second transistor and extend toward a direction opposite to the second-oriented direction in the first direction, gates of the first and second transistors are connected to the word line, and first data is stored in the ROM cell depending on the presence or absence of connection between the first local interconnect and the ground power supply line or the first bit line, and second data is stored in the ROM cell depending on the presence or absence of connection between the second local interconnect and the ground power supply line or the second bit line.

According to the above mode, the ROM cell includes the first transistor that is a three-dimensional transistor provided between the first bit line and the ground power supply line and the second transistor that is a three-dimensional transistor provided between the second bit line and the ground power supply line. The second transistor is formed above the first transistor, and the channel portions of the first and second transistors overlap each other as viewed in plan. The first and second transistors each include two transistors that lie side by side in the second direction in which the first and second bit lines and the ground power supply line extend and share the first node that is one of the source and the drain. First data is stored in the ROM cell depending on the presence or absence of connection between the first local interconnect connected to the first node shared by the two transistors of the first transistor and the ground power supply line or the first bit line. Also, second data is stored in the ROM cell depending on the presence or absence of connection between the second local interconnect connected to the first node shared by the two transistors of the second transistor and the ground power supply line or the second bit line. With this configuration, a small-area layout structure of a mask ROM can be implemented.

According to the present disclosure, a layout structure of a mask ROM using CFETs can be provided.

BRIEF DESCRIPTION OF THE DRAWINGS

FIGS. 2A and 2B are plan views showing an example of a layout structure of a memory cell according to the first embodiment.

FIGS. 3A to 3C are cross-sectional views of the memory cell of FIGS. 2A-2B.

FIGS. 6A and 6B are plan views showing an example of a layout structure of an inverter cell using a CFET.

FIGS. 7A and 7B are plan views showing another example of the layout structure of the memory cell according to the first embodiment.

FIGS. 8A and 8B are plan views showing yet another example of the layout structure of the memory cell according to the first embodiment.

FIGS. 9A and 9B are plan views showing yet another example of the layout structure of the memory cell according to the first embodiment.

FIGS. 10A and 10B are plan views showing an example of a layout structure of a memory cell according to an alteration of the first embodiment.

FIGS. 13A and 13B are plan views showing another example of the layout structure of the memory cell according to the alteration of the first embodiment.

FIGS. 14A and 14B are plan views showing yet another example of the layout structure of the memory cell according to the alteration of the first embodiment.

FIGS. 15A and 15B are plan views showing yet another example of the layout structure of the memory cell according to the alteration of the first embodiment.

FIGS. 16A and 16B are plan views showing an example of a layout structure of a memory cell according to the second embodiment.

FIGS. 20A and 20B are plan views showing another example of the layout structure of the memory cell according to the second embodiment.

FIGS. 21A and 21B are plan views showing yet another example of the layout structure of the memory cell according to the second embodiment.

FIGS. 22A and 22B are plan views showing yet another example of the layout structure of the memory cell according to the second embodiment.

FIGS. 23A and 23B are plan views showing an example of a layout structure of a memory cell according to the third embodiment.

DETAILED DESCRIPTION

Figure 35:
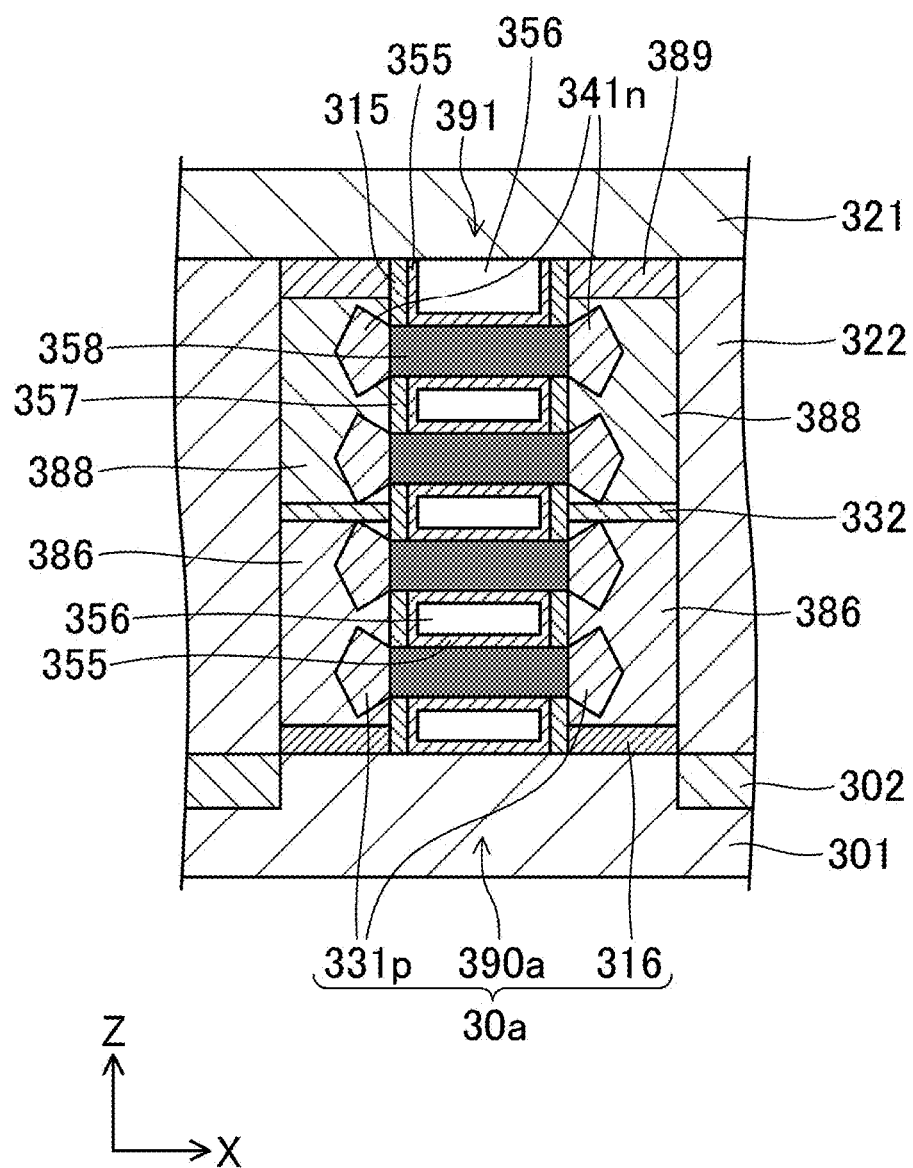
FIG. 35 is a cross-sectional view showing a structure of a semiconductor device provided with a CFET.
Figure 36:
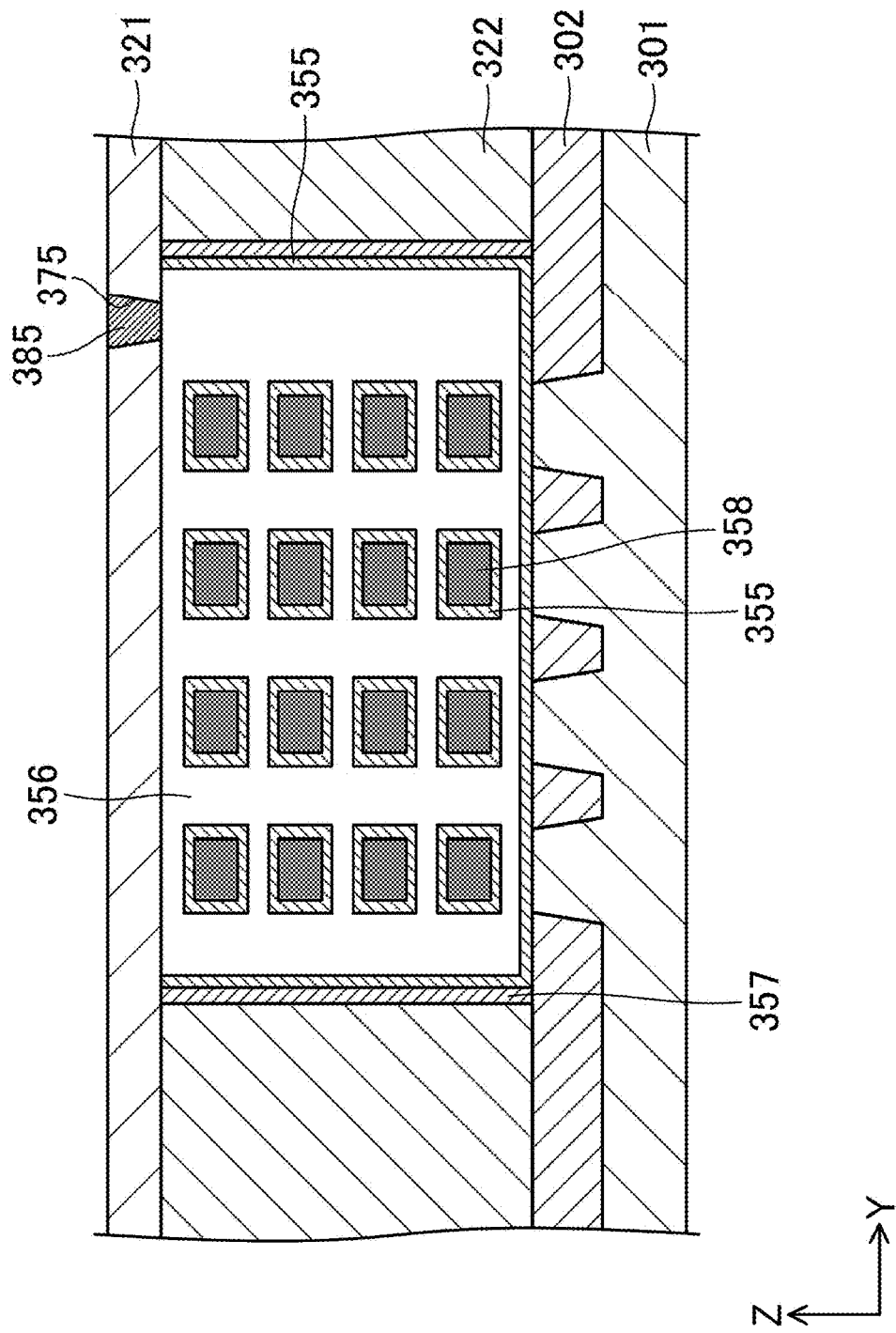
FIG. 36 is a cross-sectional view showing the structure of the semiconductor device provided with a CFET.
Figure 37:
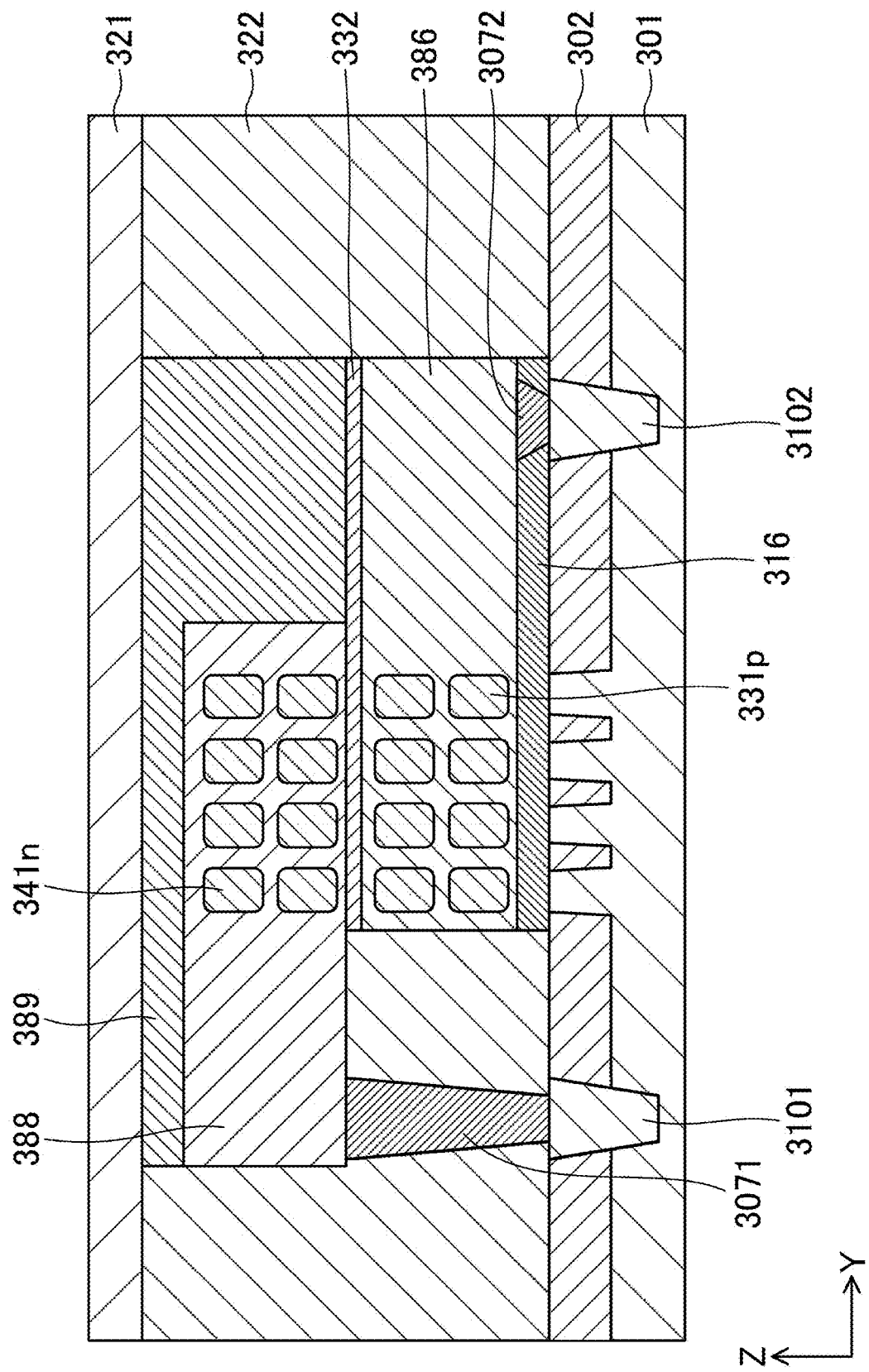
FIG. 37 is a cross-sectional view showing the structure of the semiconductor device provided with a CFET.
Figure 38:
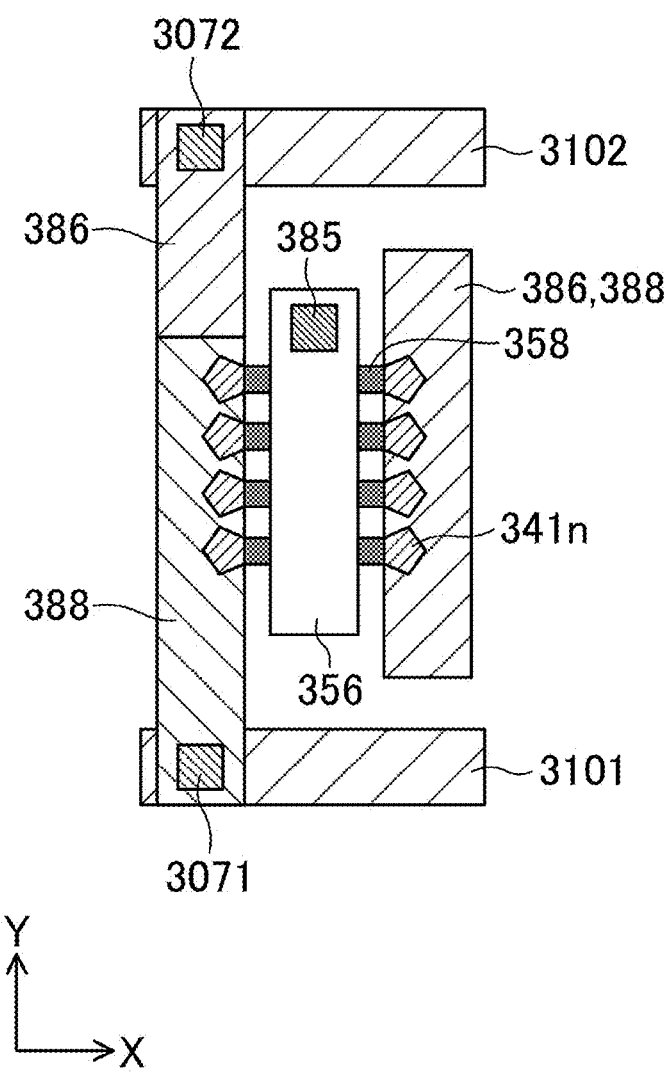
FIG. 38 is a plan view showing the structure of the semiconductor device provided with a CFET.

First, the basic structure of the CFET will be described. FIGS. 35 to 38 are views showing a structure of a semiconductor device provided with a CFET, where FIG. 35 is a cross-sectional view taken in an X direction, FIG. 36 is a cross-sectional view of a gate portion taken in a Y direction, FIG. 37 is a cross-sectional view of a source/drain portion taken in the Y direction, and FIG. 38 is a plan view. Note that the X direction refers to the direction in which nanowires extend, the Y direction refers to the direction in which a gate extends, and a Z direction refers to the direction vertical to the substrate plane. Note also that FIGS. 35 to 38 are schematic views in which the dimensions and positions of the components are not necessarily consistent with one another.

In this semiconductor device, an element isolation region 302 is formed on a semiconductor substrate 301 such as a silicon (Si) substrate, and an element active region 30$a$ is defined by the element isolation region 302. In the element active region 30$a$, an n-type FET is formed above a p-type FET.

In the element active region 30$a$, a stacked transistor structure 390$a$ is formed on the semiconductor substrate 301. The stacked transistor structure 390$a$ includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 36, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30$a$, p-type semiconductor layers 331$p$ are formed at both ends of two nanowires 358 closer to the semiconductor substrate 301. Two local interconnects 386 in contact with the p-type semiconductor layers 331$p$ are formed to sandwich the gate structure 391 in the X direction. Also, n-type semiconductor layers 341$n$ are formed at both ends of two nanowires 358 apart from the semiconductor substrate 301. Two local interconnects 388 in contact with the n-type semiconductor layers 341$n$ are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 37, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad". In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

Figure 1:
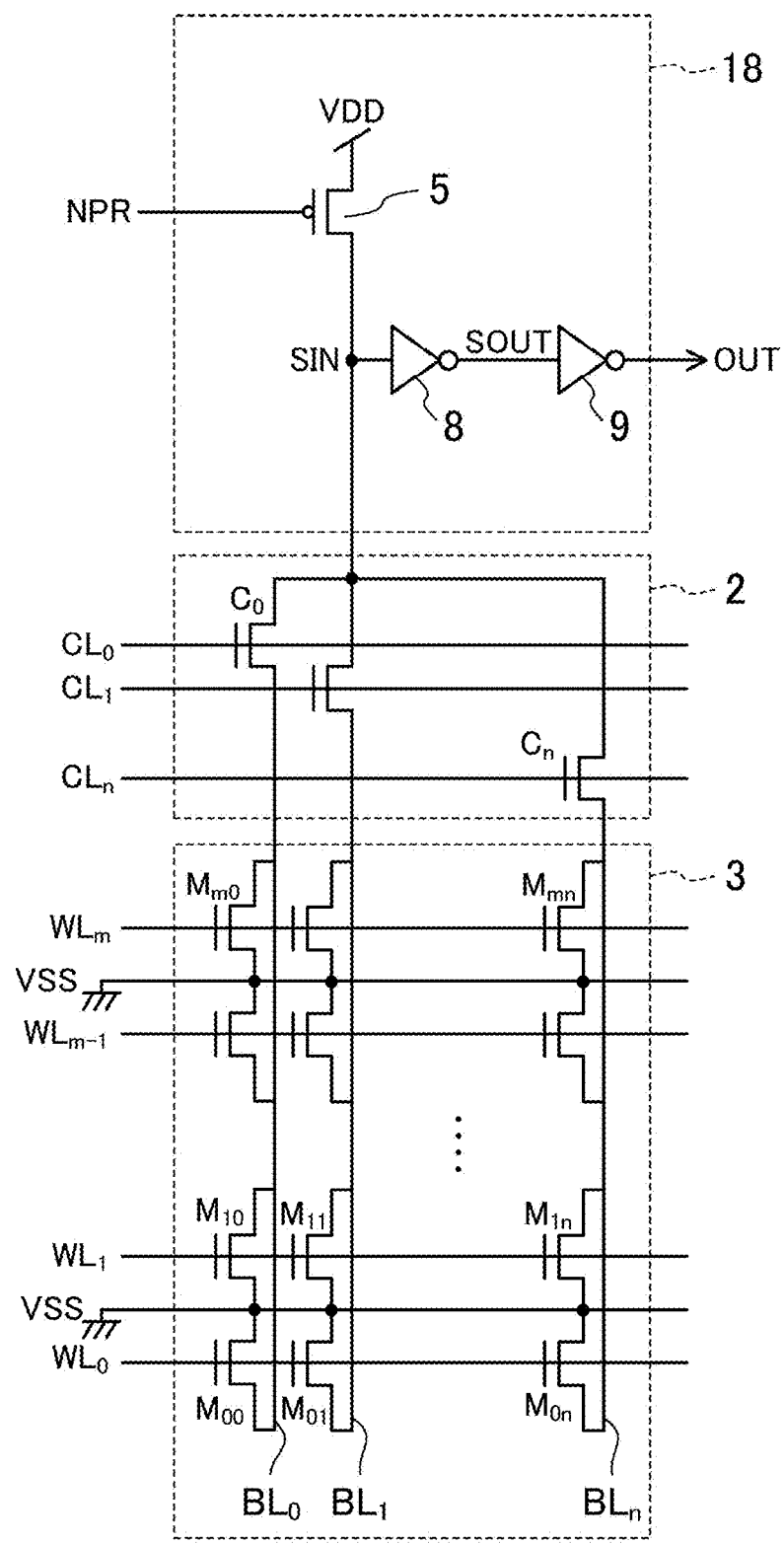
FIG. 1 is a circuit diagram showing a configuration of a contact-type mask ROM as an example of a semiconductor storage device.

FIG. 1 is a circuit diagram showing a configuration of a contact-type mask ROM as an example of a semiconductor storage device. The contact-type mask ROM is a ROM in which whether or not the drain of a memory cell transistor is connected to a bit line through a contact is made to correspond to "0" or "1" of memory data.

In FIG. 1, the mask ROM includes a memory cell array 3, a column decoder 2, and a sense amplifier 18.

The memory cell array 3 is constituted by memory cells Mij (i=0 to m, j=0 to n) of n-type MOS transistors arranged in a matrix. The gates of the memory cells Mij are connected to corresponding word lines WLi that are common for each row, and the sources thereof are connected to the ground potential VSS. The drains of the memory cells Mij are connected to corresponding bit lines BLj when the memory data is intended to be "0", and are not connected to the bit lines BLj when it is intended to be "1".

The column decoder 2 is constituted by n-type MOS transistors Cj. The drains of the n-type MOS transistors Cj are all connected together as a common drain, the gates thereof are connected to corresponding column selection signal lines CLj, and the sources thereof are connected to the corresponding bit lines BLj.

The sense amplifier 18 includes a precharge p-type MOS transistor 5, an inverter 8 that determines the output data of the memory cells Mij, and an inverter 9 that buffers the output signal of the inverter 8. A precharge signal NPR is input into the gate of the p-type MOS transistor 5, the power supply voltage VDD is supplied to the source thereof, and the drain thereof is connected to the common drain of the n-type MOS transistors Cj. The inverter 8, receiving a signal SIN of the common drain of the n-type MOS transistors Cj, determines the output data of the memory cells Mij. The inverter 9, receiving an output signal SOUT of the inverter 8, outputs memory data of the memory cells Mij.

The operation of the mask ROM of FIG. 1 will be described taking as an example the case of reading data of a memory cell M00.

First, among the column selection signal lines CLj, CL0 is made high and the other CL1 to CLn are made low. This turns on C0, among the transistors constituting the column decoder 2, and turns off the other transistors C1 to Cn. Also, the word line WL0 is changed from a low level as the non-selected state to a high level as the selected state.

The precharge signal NPR is then changed from high to low, to turn on the precharge p-type MOS transistor 5.

In the case when the drain of the memory cell M00 is connected to the bit line BL0, since the current capability of the memory cell M00 is greater than that of the precharge p-type MOS transistor 5, the voltage of the input signal SIN at the inverter 8 becomes lower than the switching level of the inverter 8. Therefore, the output signal SOUT of the inverter 8 keeps high, and an output signal OUT of the inverter 9 keeps low.

On the other hand, in the case when the drain of the memory cell M00 is not connected to the bit line BL0, the bit line BL0 is charged by the precharge p-type MOS transistor 5, and thus the voltage of the input signal SIN at the inverter 8 becomes higher than the switching level of the inverter 8. Therefore, the output signal SOUT of the inverter 8 becomes low, and the output signal OUT of the inverter 9 becomes high.

That is, when the drain of a memory cell is connected to a bit line, a low level is output (memory data "0"), and when the drain of a memory cell is not connected to a bit line, a high level is output (memory data "1").

Note that, in the mask ROM according to this disclosure, the method of storing a value in each memory cell includes a case of setting the value by connection or disconnection between the memory cell and a bit line and a case of setting the value by connection or disconnection between the memory cell and VSS.

First Embodiment

FIGS. 2A-2B and 3A-3C are views showing an example of a layout structure of a mask ROM according to the first embodiment, where FIGS. 2A-2B are plan views of a memory cell, and FIGS. 3A-3C are cross-sectional views of the memory cell taken in the vertical direction as viewed in plan. Specifically, FIG. 2A shows an upper part, i.e., a portion including a three-dimensional transistor formed away from a substrate (an n-type nanowire FET in the illustrated example), and FIG. 2B shows a lower part, i.e., a portion including a three-dimensional transistor formed closer to the substrate (an n-type nanowire FET in the illustrated example). FIG. 3A shows a cross section taken along line Y1-Y1', FIG. 3B shows a cross section taken along line Y2-Y2', and FIG. 3C shows a cross section taken along line Y3-Y3'.

In the following description, in the plan views such as FIGS. 2A-2B, the horizontal direction in the figure is called an X direction (corresponding to the first direction), the vertical direction in the figure is called a Y direction (corresponding to the second direction), and the direction vertical to the substrate plane is called the Z direction (corresponding to the depth direction). Note that the X direction is a direction in which gate interconnects and word lines extend and the Y direction is a direction in which nanowires and bit lines extend. That is, in the drawings for this and subsequent embodiments, the X and Y directions are reversed from those in FIGS. 35 to 38. The dotted lines running horizontally and vertically in the plan views such as FIGS. 2A-2B and the dotted lines running vertically in the cross-sectional views such as FIGS. 3A-3C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

Also, in the drawings, any contact determining the memory value of a memory cell is marked with the letter "D".

FIGS. 2A-2B and 3A-3C correspond to a layout of two bits of memory cells lying side by side in the horizontal direction in the memory cell array 3 in FIG. 1. A transistor connected to the bit line BL0 is formed in the lower part shown in FIG. 2B, and a transistor connected to the bit line BL1 is formed in the upper part shown in FIG. 2A. That is, the transistors shown in FIGS. 2A and 2B correspond to the n-type transistors M01 and M00, respectively, shown in the circuit diagram of FIG. 1, for example. The broken line defines the bounds of the memory cell.

Figure 4:
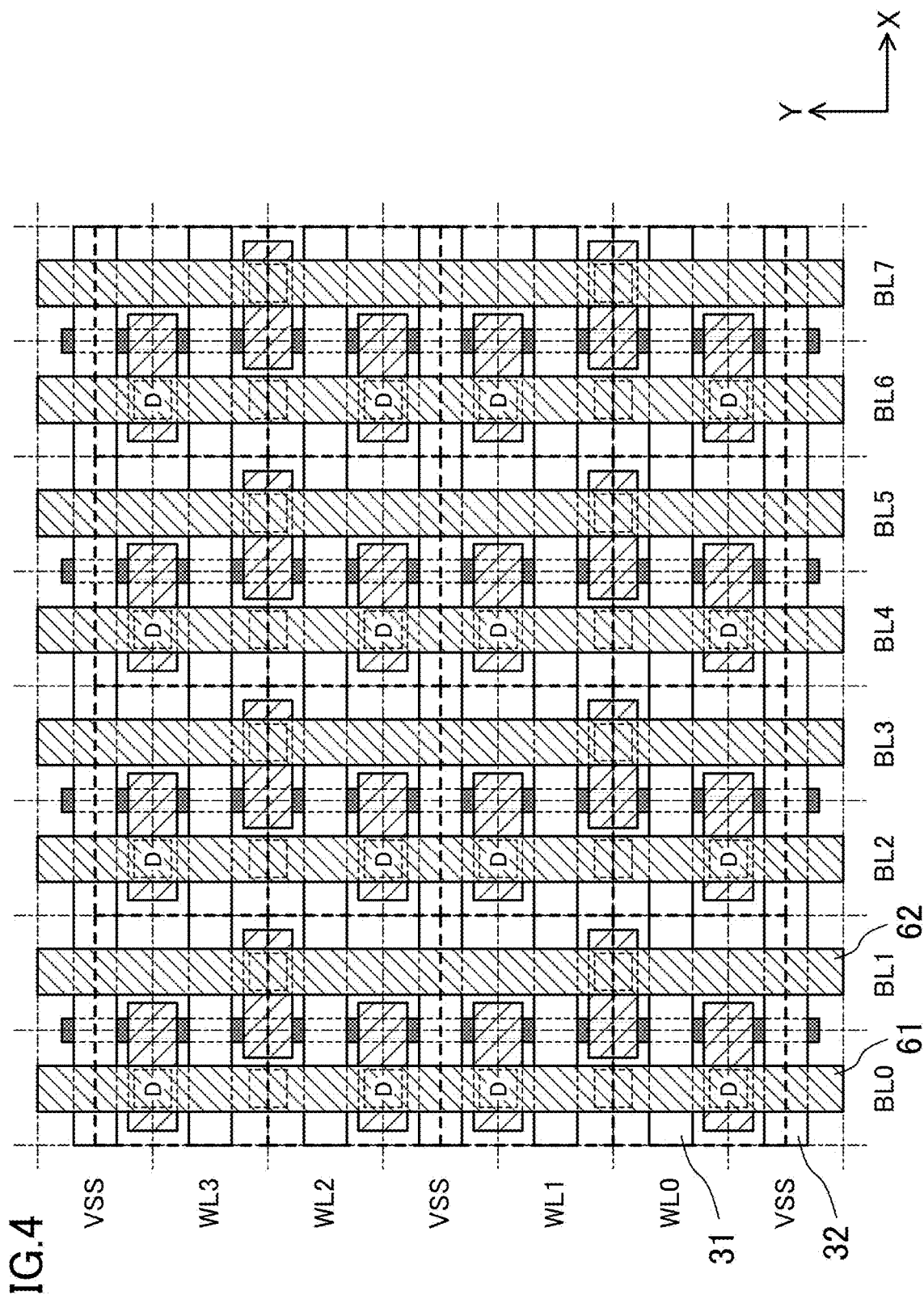
FIG. 4 shows a layout structure of an upper part of a memory cell array using the memory cell of FIGS. 2A-2B and 3A-3C.
Figure 5:
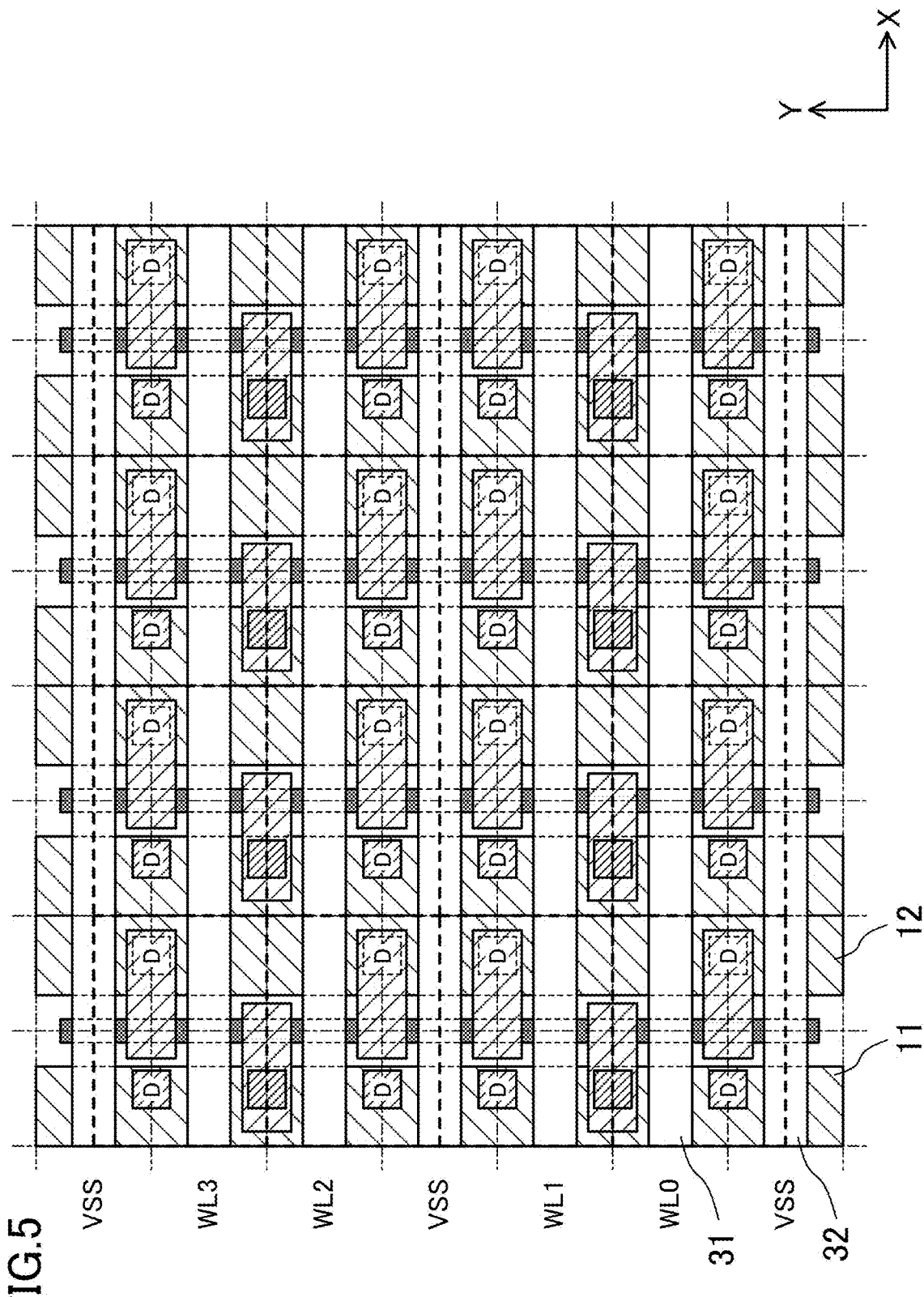
FIG. 5 shows a layout structure of a lower part of the memory cell array using the memory cell of FIGS. 2A-2B and 3A-3C.

FIGS. 4 and 5 are views showing an layout structure of a memory cell array using the memory cell of FIGS. 2A-2B and 3A-3C, where FIG. 4 shows the upper part and FIG. 5 shows the lower part.

As shown in FIG. 2B, power supply lines 11 and 12 extending in the Y direction are provided on both ends of the memory cell in the X direction. The power supply lines 11 and 12 are both buried power rails (BPRs) formed in a buried interconnect layer. The power supply lines 11 and 12 both supply the power supply voltage VSS.

As shown in FIG. 2A, interconnects 61 and 62 extending in the Y direction are formed in an M1 interconnect layer. The M1 interconnect 61 corresponds to the bit line BL0 and the M1 interconnect 62 corresponds to the bit line BL1.

A nanowire 21 extending in the Y direction is formed in the lower part of the memory cell, and a nanowire 26 extending in the Y direction is formed in the upper part of the memory cell. The nanowires 21 and 26 overlap each other as viewed in plan. Pads 22a and 22b doped with an n-type semiconductor are formed at both ends of the nanowire 21, and pads 27a and 27b doped with an n-type semiconductor are formed at both ends of the nanowire 26. The nanowire 21 constitutes the channel portion of the n-type transistor M00, and the pads 22a and 22b constitute terminals that are to be the source or drain of the n-type transistor M00. The nanowire 26 constitutes the channel portion of the n-type transistor M01, and the pads 27a and 27b constitute terminals that are to be the source or drain of the n-type transistor M01. The n-type transistor M00 is formed above the buried interconnect layer in the Z direction, and the n-type transistor M01 is formed above the n-type transistor M00 in the Z direction.

A gate interconnect 31 extends in the X direction and also extends in the Z direction over the lower and upper parts of the memory cell. The gate interconnect 31 is to be the gates of the n-type transistors M00 and M01. That is, the n-type transistor M00 is constituted by the nanowire 21, the gate interconnect 31, and the pads 22a and 22b, and the n-type transistor M01 is constituted by the nanowire 26, the gate interconnect 31, and the pads 27a and 27b. As will be described later, the gate interconnect 31 is connected to the word line WL0.

A dummy gate interconnect 32 is formed on the lower end of the memory cell in the figure. Like the gate interconnect 31, the dummy gate interconnect 32 extends in the X and Z directions. A nanowire 23 is formed to extend from the pad 22b downward in the figure, and a nanowire 28 is formed to extend from the pad 27b downward in the figure. N-type transistors DN1 and DN2 are formed by the nanowire 23 and the dummy gate interconnect 32 and by the nanowire 28 and the dummy gate interconnect 32, respectively. Since the dummy gate interconnect 32 is connected to VSS (not shown), the n-type transistors DN1 and DN2 remain off, exerting no influence on the logical operation of the circuit. They are therefore not illustrated in the circuit diagram of FIG. 1.

In the lower part of the memory cell, local interconnects 41 and 42 extending in the X direction are formed. The local interconnect 41 is connected with the pad 22a and extends leftward from the pad 22a in the figure. The local interconnect 42 is connected with the pad 22b and extends rightward from the pad 22b in the figure. In the upper part of the memory cell, local interconnects 43 and 44 extending in the X direction are formed. The local interconnect 43 is connected with the pad 27a and extends rightward from the pad 27a in the figure. The local interconnect 44 is connected with the pad 27b and extends leftward from the pad 27b in the figure. The local interconnect 41 is connected with the M1 interconnect 61 through a contact 51, and the local interconnect 43 is connected with the M1 interconnect 62 through a contact 52.

Contacts 71 and 72 each determine the memory value of the memory cell by their presence or absence. The contact 71 connects the local interconnect 42 and the power supply line 12 when it is formed, and the contact 72 connects the local interconnect 44 and the power supply line 11 when it is formed.

FIGS. 4 and 5 show a configuration of an array of memory cells, four arranged in the X direction and four in the Y direction, using the memory cell of FIGS. 2A-2B. The memory cells are inverted in the Y direction every other row in the Y direction. The gate interconnects 31, shown in the memory cell of FIGS. 2A-2B, extend in line in the X direction, constituting the word lines WL0 to WL3. The dummy gate interconnects 32 are supplied with VSS. The M1 interconnects 61 and 62, shown in the memory cell of FIGS. 2A-2B, extend in line in the Y direction, constituting the bit lines BL0 to BL7. Between the word lines WL0 and WL1, the drains are shared by the adjacent transistors, and between the word lines WL2 and WL3, the drains are shared by the adjacent transistors.

As described above, according to this embodiment, the ROM cell includes the transistor M00 provided between the M1 interconnect 61 that is to be a bit line and the power supply line 12 that supplies VSS and the transistor M01 provided between the M1 interconnect 62 that is to be a bit line and the power supply line 11 that supplies VSS. The transistor M01 is formed above the transistor M00, and the channel portions of the transistors M00 and M01 overlap each other as viewed in plan. First data is stored in the ROM cell depending on the presence or absence of connection between the local interconnect 42 connected to the source of the transistor M00 and the power supply line 12. Also, second data is stored in the ROM cell depending on the presence or absence of connection between the local interconnect 44 connected to the source of the transistor M01 and the power supply line 11. In this way, a small-area layout structure of a mask ROM can be implemented.

The upper transistor and the lower transistor are both n-type transistors, forming separate memory cells. Also, the transistors of any adjacent memory cells in the Y direction share the drain. This realizes reduction in the area of the semiconductor storage device. As is found from the layout of FIG. 4, with the dummy gate interconnect 32 provided in the memory cell, it is possible to form transistors continuously in the Y direction, whereby manufacturing variations of transistors can be reduced.

In a general CFET, the upper and lower transistors are different in conductivity type. FIGS. 6A-6B show a layout structure of an inverter cell using a CFET. An upper transistor N1 shown in FIG. 6A is an n-type transistor, and a lower transistor P1 shown in FIG. 6B is a p-type transistor. The transistor P1 and the transistor N1 are connected in series between a power supply line 611 supplying VDD and a power supply line 612 supplying VSS. The transistor P1 has a nanowire 621 that is to be a channel portion and pads 622a and 622b, and the transistor N1 has a nanowire 626 that is to be a channel portion and pads 627a and 627b. A gate interconnect 631 is to be the common gate of the transistor P1 and the transistor N1. An M1 interconnect 661 that is to be the input of the inverter is connected with the gate interconnect 631. An M1 interconnect 662 that is to be the output of the inverter is connected with local interconnects 642 and 644 connected with the drains of the transistor P1 and the transistor N1.

On the contrary, in the mask ROM of this embodiment, both the upper and lower transistors are n-type transistors. That is, a semiconductor chip having the mask ROM of this embodiment includes a region where the lower part of a CFET is a p-type transistor and a region where it is an n-type transistor. In such a semiconductor chip, transistors in the lower part may be manufactured in the following manner, for example. That is, at the time of formation of transistors in the lower part, the portion for n-type transistors is masked to dope the other portion into p-type conductivity. Thereafter, the portion other than the portion for n-type transistors is masked to dope the portion for n-type transistors into n-type conductivity. By placing n-type transistors and p-type transistors away from each other, the p-type doping and the n-type doping can be performed without fail.

(Other Layout Structure Examples)

FIGS. 7A-7B to 9A-9B are plan views showing other examples of the layout structure of the memory cell according to this embodiment, where FIGS. 7A, 8A, and 9A show the upper part and FIGS. 7B, 8B, and 9B show the lower part. The layout structures of FIGS. 7A-7B to 9A-9B are basically the same as that of FIGS. 2A-2B, except for the following points.

In the layout structure of FIGS. 7A-7B, the dummy gate interconnect 32 is not formed, nor are the n-type transistors DN1 and DN2 formed.

In the layout structure of FIGS. 8A-8B, the local interconnects for the source and the drain extend from the same side of the transistor. In the lower transistor, both local interconnects 41 and 42A extend leftward in the figure, and the memory value is set depending on the presence or absence of a contact 71A between the local interconnect 42A and the power supply line 11. In the upper transistor, both local interconnects 43 and 44A extend rightward in the figure, and the memory value is set depending on the presence or absence of a contact 72A between the local interconnect 44A and the power supply line 12.

In the layout structure of FIGS. 9A-9B, in comparison with the layout structure of FIGS. 8A-8B, the dummy gate interconnect 32 is not formed, nor are the n-type transistors DN1 and DN2 formed.

(Alteration of First Embodiment)

The embodiment described above has a layout structure where the memory value of the memory cell is determined by the presence or absence of a contact between a local interconnect connected to the source of the transistor and the ground power supply line. On the contrary, in the layout structure of this alteration, the memory value of the memory cell is determined by the presence or absence of a contact between a local interconnect connected to the drain of the transistor and the bit line.

FIGS. 10A-10B are plan views of a memory cell of this alteration, where FIG. 10A shows the upper part and FIG. 10B shows the lower part. In the layout structure of FIGS. 10A-10B, components in common with those in FIGS. 2A-2B are denoted by the same reference characters, and the description thereof is omitted here.

The local interconnect 42 is connected with the power supply line 12 through a contact 54, and the local interconnect 44 is connected with the power supply line 11 through a contact 53. Contacts 73 and 74 each determine the memory value of the memory cell by their presence or absence. The contact 73 connects the local interconnect 41 and the M1 interconnect 61 when it is formed, and the contact 74 connects the local interconnect 43 and the M1 interconnect 62 when it is formed.

A dummy gate interconnect 33 is formed on the upper end of the memory cell in the figure. Like the gate interconnect 31, the dummy gate interconnect 33 extends in the X and Z directions. Since the dummy gate interconnect 33 is connected to VSS (not shown), like the dummy gate interconnect 32 in FIGS. 2A-2B, it exerts no influence on the logical operation of the circuit.

Figure 11:
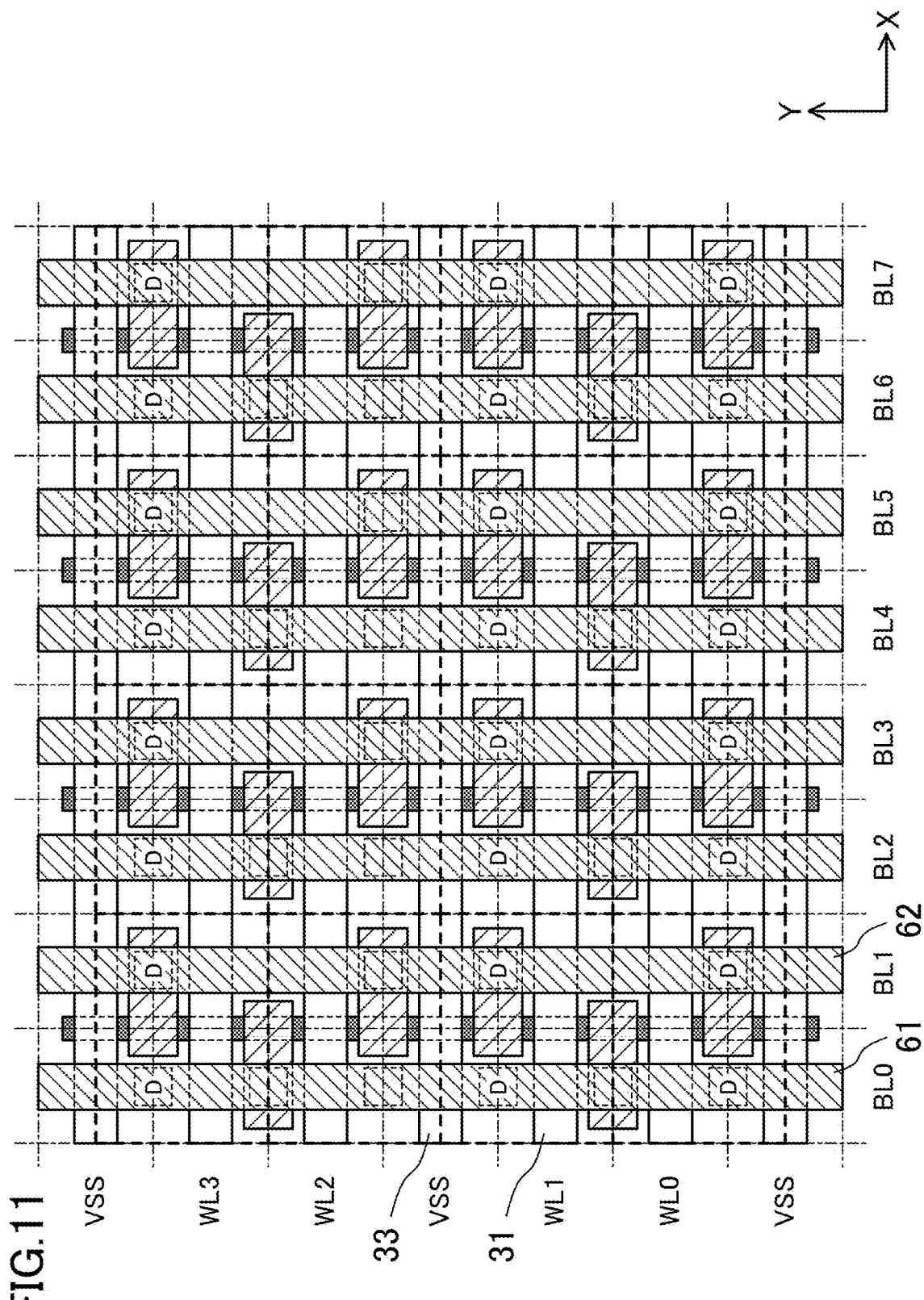
FIG. 11 shows a layout structure of an upper part of a memory cell array using the memory cell of FIGS. 10A-10B.
Figure 12:
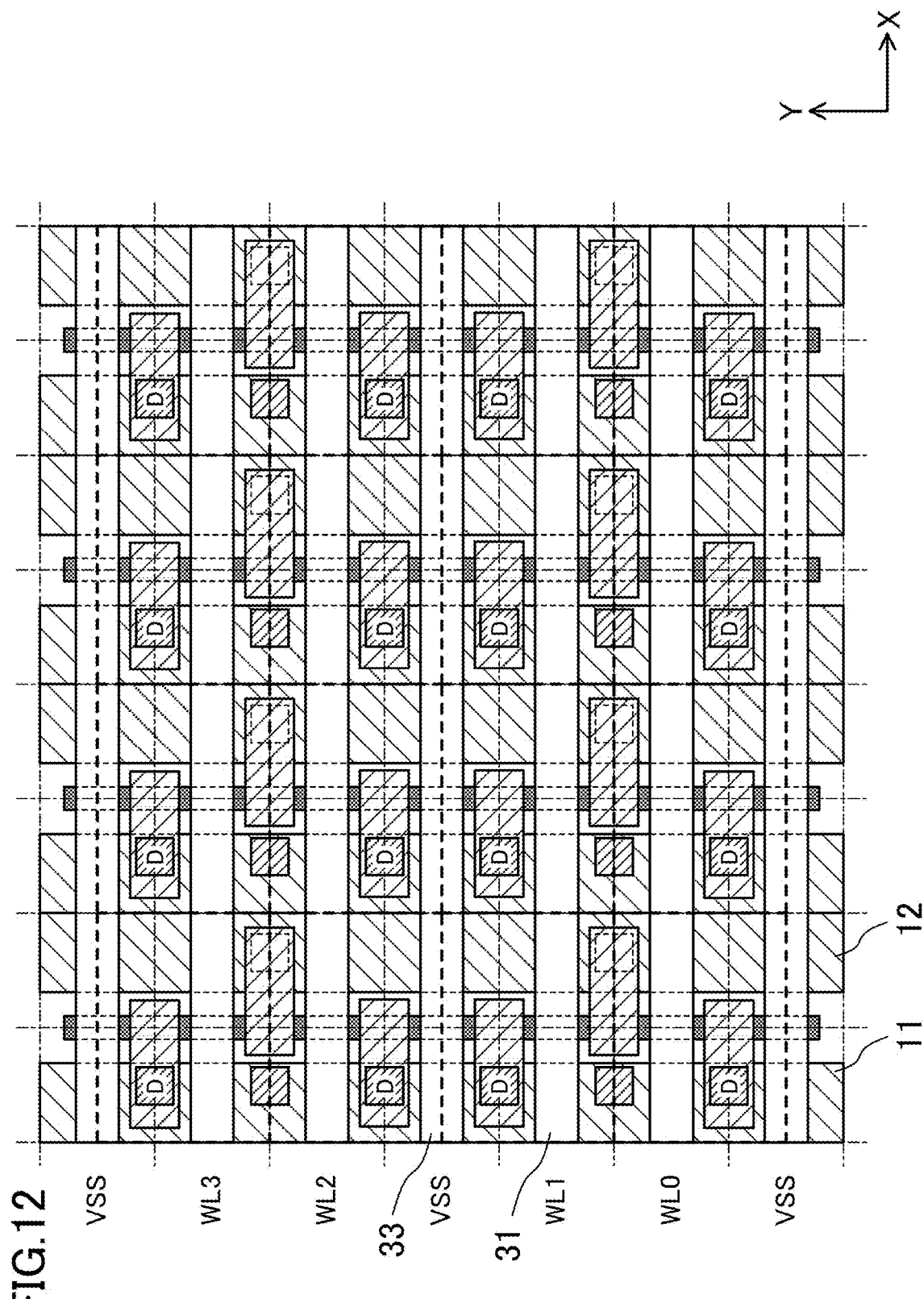
FIG. 12 shows a layout structure of a lower part of the memory cell array using the memory cell of FIGS. 10A-10B.

FIGS. 11 and 12 show a configuration of an array of memory cells, four arranged in the X direction and four in the Y direction, using the memory cell of FIGS. 10A-10B. The memory cells are inverted in the Y direction every other row in the Y direction. The gate interconnects 31, shown in the memory cell of FIGS. 10A-10B, extend in line in the X direction, constituting the word lines WL0 to WL3. The dummy gate interconnects 33 are supplied with VSS. The M1 interconnects 61 and 62, shown in the memory cell of FIGS. 10A-10B, extend in line in the Y direction, constituting the bit lines BL0 to BL7. Between the word lines WL0 and WL1, the sources are shared by the adjacent transistors, and between the word lines WL2 and WL3, the sources are shared by the adjacent transistors.

(Other Layout Structure Examples)

FIGS. 13A-13B to 15A-15B are plan views showing other examples of the layout structure of the memory cell according to this alteration, where FIGS. 13A, 14A, and 15A show the upper part and FIGS. 13B, 14B, and 15B show the lower part. The layout structures of 13A-13B to 15A-15B are basically the same as that of FIGS. 10A-10B, except for the following points.

The layout structure of FIGS. 13A-13B does not have the dummy gate interconnect 33. In the layout structure of FIGS. 14A-14B, the local interconnects for the source and the drain extend from the same side of the transistor. In the lower transistor, both local interconnects 41 and 42A extend leftward in the figure, and the local interconnect 42A and the power supply line 11 are connected through a contact 54A. In the upper transistor, both local interconnects 43 and 44A extend rightward in the figure, and the local interconnect 44A and the power supply line 12 are connected through a contact 53A. In the layout structure of FIGS. 15A-15B, in comparison with the layout structure of FIGS. 14A-14B, the dummy gate interconnect 33 is not formed.

Second Embodiment

Figure 17A:
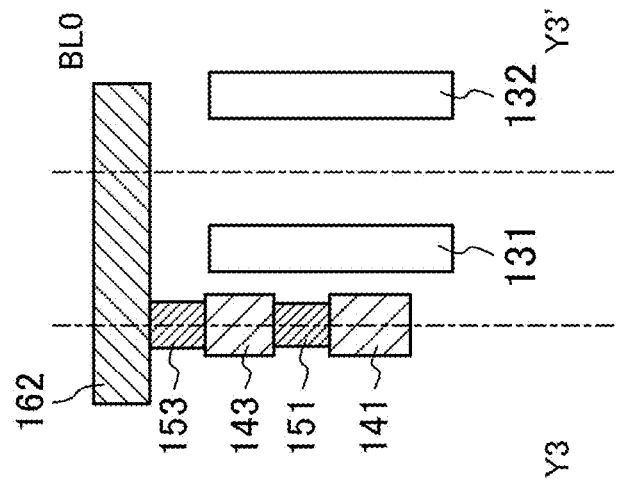
FIGS. 17A to 17C are cross-sectional views of the memory cell of FIGS. 16A-16B.
Figure 17B:
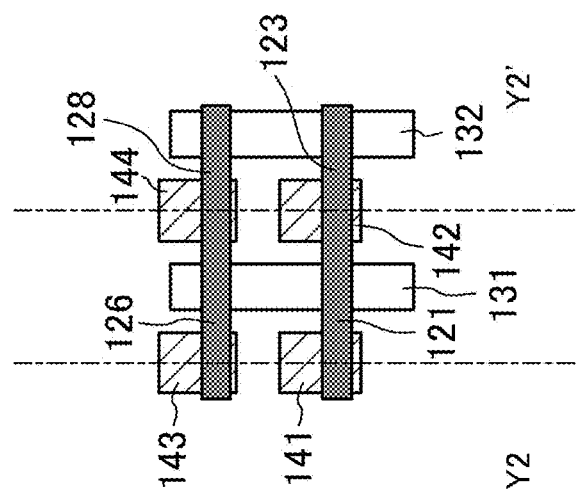
Figure 17C:
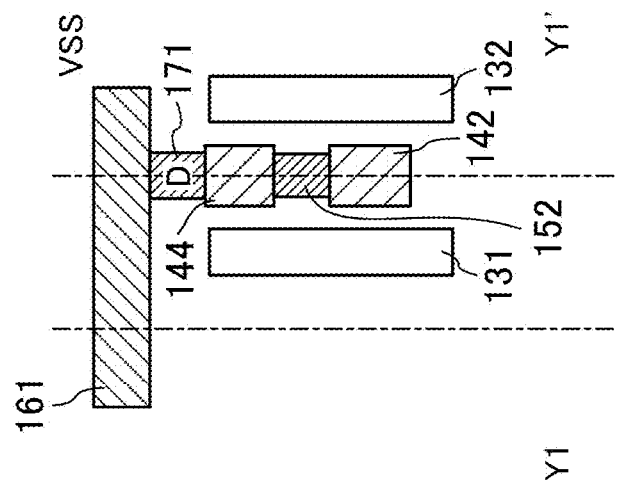

FIGS. 16A-16B and 17A-17C are views showing an example of a layout structure of a mask ROM according to the second embodiment, where FIGS. 16A-16B are plan views of a memory cell, and FIGS. 17A-17C are cross-sectional views of the memory cell taken in the vertical direction as viewed in plan. Specifically, FIG. 16A shows an upper part and FIG. 16B shows a lower part. FIG. 17A shows a cross section taken along line Y1-Y1', FIG. 17B shows a cross section taken along line Y2-Y2', and FIG. 17C shows a cross section taken along line Y3-Y3'.

FIGS. 16A-16B and 17A-17C correspond to a layout of one bit of memory cell in the memory cell array 3 in FIG. 1. An n-type transistor formed in the upper part shown in FIG. 16A and an n-type transistor formed in the lower part shown in FIG. 16B constitute a memory cell of one bit. That is, the transistors shown in FIGS. 16A and 16B correspond to the n-type transistor M00 shown in the circuit diagram of FIG. 1, for example. The broken line defines the bounds of the memory cell.

Figure 18:
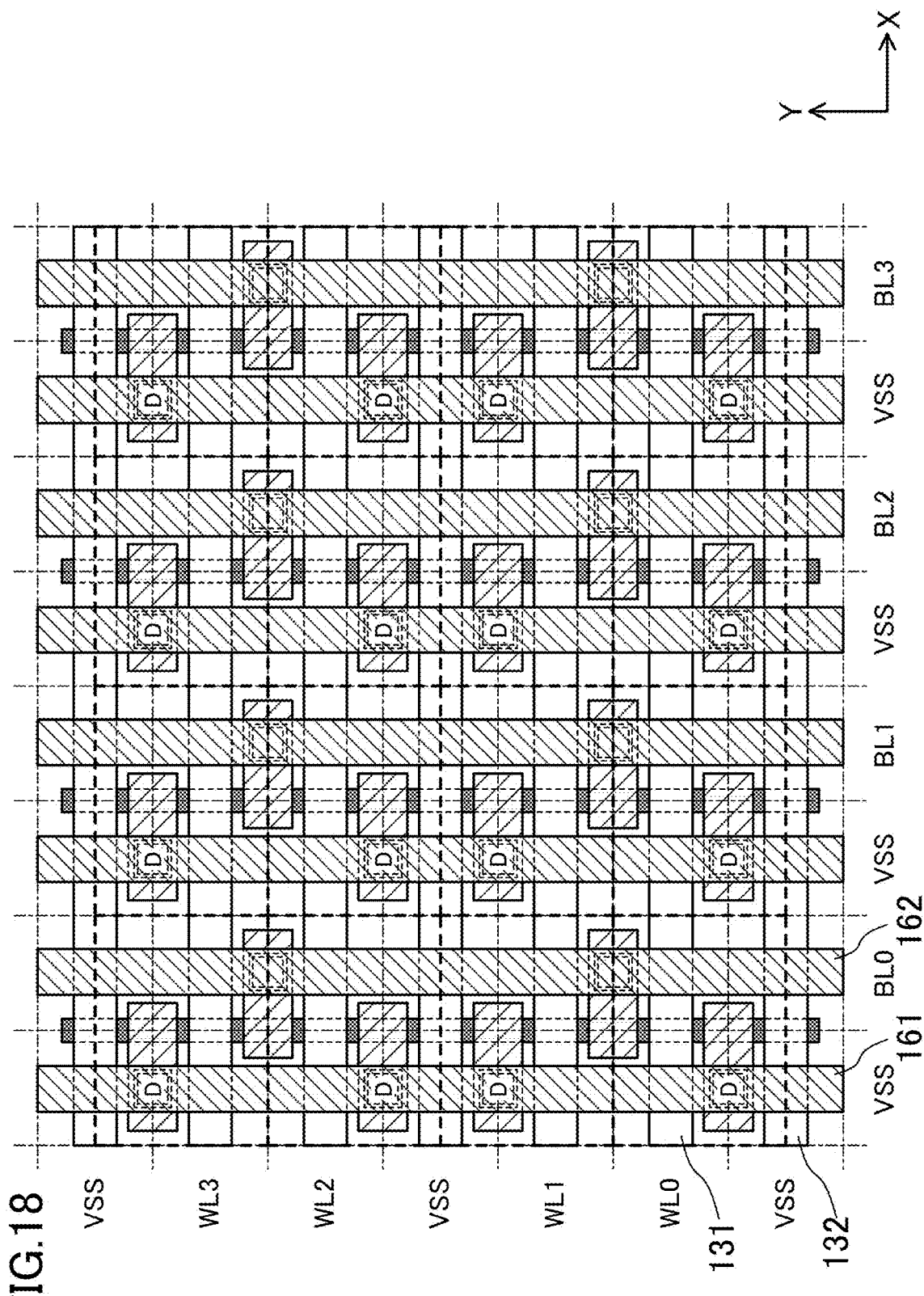
FIG. 18 shows a layout structure of an upper part of a memory cell array using the memory cell of FIGS. 16A-16B and 17A-17C.
Figure 19:
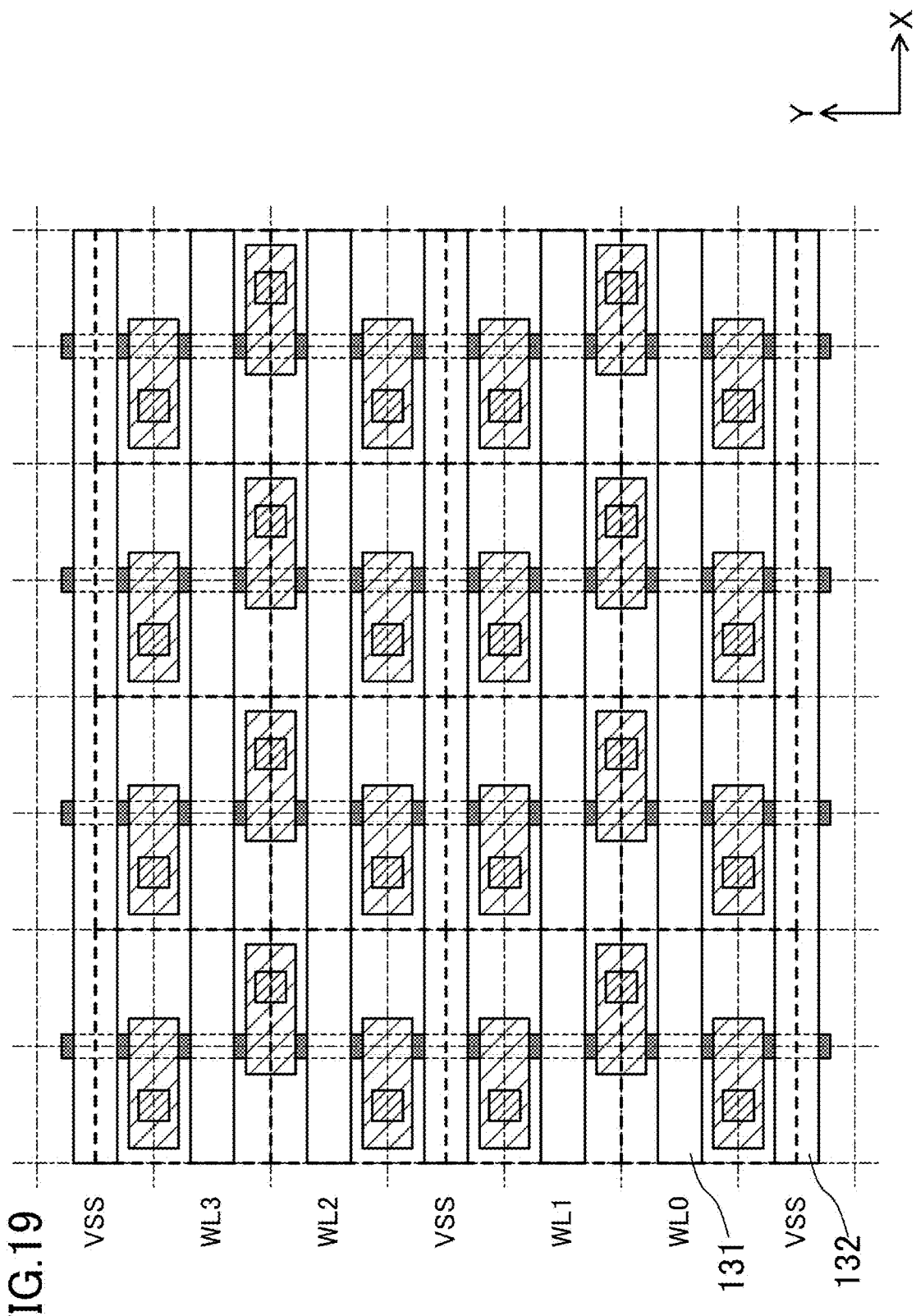
FIG. 19 shows a layout structure of a lower part of the memory cell array using the memory cell of FIGS. 16A-16B and 17A-17C.

FIGS. 18 and 19 are views showing an layout structure of a memory cell array using the memory cell of FIGS. 16A-16B and 17A-17C, where FIG. 18 shows the upper part and FIG. 19 shows the lower part.

As shown in FIG. 16A, interconnects 161 and 162 extending in the Y direction are formed in an M1 interconnect layer. The interconnect 161 supplies the power supply voltage VSS and the interconnect 162 corresponds to the bit line BL0.

A nanowire 121 extending in the Y direction is formed in the lower part of the memory cell, and a nanowire 126 extending in the Y direction is formed in the upper part of the memory cell. The nanowires 121 and 126 overlap each other as viewed in plan. Pads 122a and 122b doped with an n-type semiconductor are formed at both ends of the nanowire 121, and pads 127a and 127b doped with an n-type semiconductor are formed at both ends of the nanowire 126. The nanowire 121 constitutes the channel portion of an n-type transistor Ma, and the pads 122a and 122b constitute terminals that are to be the source or drain of the n-type transistor Ma. The nanowire 126 constitutes the channel portion of an n-type transistor Mb, and the pads 127a and 127b constitute terminals that are to be the source or drain of the n-type transistor Mb. The n-type transistor Ma is formed above the buried interconnect layer in the Z direction, and the n-type transistor Mb is formed above the n-type transistor Ma in the Z direction.

A gate interconnect 131 extends in the X direction and also extends in the Z direction over the lower and upper parts of the memory cell. The gate interconnect 131 is to be the gates of the n-type transistors Ma and Mb. That is, the n-type transistor Ma is constituted by the nanowire 121, the gate interconnect 131, and the pads 122a and 122b, and the n-type transistor Mb is constituted by the nanowire 126, the gate interconnect 131, and the pads 127a and 127b. As will be described later, the gate interconnect 131 is connected to the word line WL0.

A dummy gate interconnect 132 is formed on the lower end of the memory cell in the figure. Like the gate interconnect 131, the dummy gate interconnect 132 extends in the X and Z directions. A nanowire 123 is formed to extend from the pad 122b downward in the figure, and a nanowire 128 is formed to extend from the pad 127b downward in the figure. N-type transistors DN1 and DN2 are formed by the nanowire 123 and the dummy gate interconnect 132 and by the nanowire 128 and the dummy gate interconnect 132, respectively. Since the dummy gate interconnect 132 is connected to VSS (not shown), the n-type transistors DN1 and DN2 remain off, exerting no influence on the logical operation of the circuit. They are therefore not illustrated in the circuit diagram of FIG. 1.

In the lower part of the memory cell, local interconnects 141 and 142 extending in the X direction are formed. The local interconnect 141 is connected with the pad 122a and extends rightward from the pad 122a in the figure. The local interconnect 142 is connected with the pad 122b and extends leftward from the pad 122b in the figure. In the upper part of the memory cell, local interconnects 143 and 144 extending in the X direction are formed. The local interconnect 143 is connected with the pad 127a and extends rightward from the pad 127a in the figure. The local interconnect 144 is connected with the pad 127b and extends leftward from the pad 127b in the figure.

The local interconnect 141 is connected with the local interconnect 143 through a contact 151, and the local interconnect 142 is connected with the local interconnect 144 through a contact 152. The local interconnect 143 is connected with the M1 interconnect 162 through a contact 153.

A contact 171 determines the memory value of the memory cell by its presence or absence. The contact 171 connects the local interconnect 144 and the M1 interconnect 161 when it is formed.

FIGS. 18 and 19 show a configuration of an array of memory cells, four arranged in the X direction and four in the Y direction, using the memory cell of FIGS. 16A-16B. The memory cells are inverted in the Y direction every other row in the Y direction. The gate interconnects 131, shown in the memory cell of FIGS. 16A-16B, extend in line in the X direction, constituting the word lines WL0 to WL3. The dummy gate interconnects 132 are supplied with VSS. The M1 interconnects 161 and 162, shown in the memory cell of FIGS. 16A-16B, extend in line in the Y direction, constituting the lines for supplying the power supply voltage VSS and the bit lines BL0 to BL3. Between the word lines WL0 and WL1, the drains are shared by the adjacent transistors, and between the word lines WL2 and WL3, the drains are shared by the adjacent transistors.

As described above, according to this embodiment, the ROM cell includes the transistors Ma and Mb provided between the M1 interconnect 162 that is to be a bit line and the M1 interconnect 161 that supplies VSS. The transistor Mb is formed above the transistor Ma, and the channel portions of the transistors Ma and Mb overlap each other as viewed in plan. The local interconnect 142 connected to the source of the transistor Ma and the local interconnect 144 connected to the source of the transistor Mb are mutually connected. The local interconnect 141 connected to the drain of the transistor Ma and the local interconnect 143 connected to the drain of the transistor Mb are mutually connected. Data is stored in the ROM cell depending on the presence or absence of connection between the local interconnect 144 and the M1 interconnect 161. In this way, a small-area layout structure of a mask ROM can be implemented.

In this embodiment, since a memory cell of one bit is formed by two transistors formed in the upper and lower parts, the drive capability is great, compared with the first embodiment, permitting high-speed operation. Also, if the transistor characteristics vary between the upper part and the lower part, characteristics may vary every bit line in the first embodiment. This embodiment however will not be affected by such variations. Moreover, since the memory value of the memory cell is set using a contact at an upper position compared with the case of the first embodiment, the manufacturing time for changing the memory value of the memory cell can be shortened. On the other hand, in the first embodiment, the area of the memory cell array can be reduced compared with this embodiment.

Also, since lines for supplying the power supply voltage VSS are provided between bit lines, crosstalk noise between bit lines can be reduced. This leads to stability of the operation.

(Other Layout Structure Examples)

FIGS. 20A-20B to 22A-22B are plan views showing other examples of the layout structure of the memory cell according to this embodiment, where FIGS. 20A, 21A, and 22A show the upper part and FIGS. 20B, 21B, and 22B show the lower part. The layout structures of FIGS. 20A-20B to 22A-22B are basically the same as that of FIGS. 16A-16B, except for the following points.

In the layout structure of FIGS. 20A-20B, the dummy gate interconnect 132 is not formed, nor are the n-type transistors DN1 and DN2 formed.

In the layout structure of FIGS. 21A-21B, a power supply line 111 extending in the Y direction is provided on the left end of the memory cell in the figure. The power supply line 111 is a BPR formed in the buried interconnect layer and supplies the power supply voltage VSS. A contact 172, in place of the contact 171, determines the memory value of the memory cell by its presence or absence. The contact 172 connects the local interconnect 142 and the power supply line 111 when it is formed. The M1 interconnect 161 is not connected with the memory cell, but functions for reduction of crosstalk noise between bit lines.

In the layout structure of FIGS. 22A-22B, in comparison with the layout structure of FIGS. 21A-21B, the dummy gate interconnect 132 is not formed, nor are the n-type transistors DN1 and DN2 formed.

(Alteration of Second Embodiment)

The embodiment described above has a layout structure where the memory value of the memory cell is determined by the presence or absence of a contact between a local interconnect connected to the source of the transistor and the ground power supply line. On the contrary, in the layout structure of this alteration, the memory value of the memory cell is determined by the presence or absence of a contact between a local interconnect connected to the drain of the transistor and the bit line.

Although illustration is omitted here, the contact 153 in FIGS. 16A-16B and 17A-17C, for example, may be used as the contact for determining the memory value of the memory cell by its presence or absence. The contact 171 may be changed to a contact connecting the local interconnect 144 and the M1 interconnect 161. In formation of a memory cell array using this memory cell, layout may be made so that any transistors adjacent in the Y direction share the source (the local interconnects 142 and 144).

Third Embodiment

FIGS. 23A-23B are plan views showing an example of a layout structure of a mask ROM according to the third embodiment, where FIG. 23A shows an upper part and FIG. 23B shows a lower part.

FIGS. 23A-23B correspond to a layout of two bits of memory cells lying side by side in the horizontal direction in the memory cell array 3 in FIG. 1. A transistor connected to the bit line BL0 is formed in the lower part shown in FIG. 23B, and a transistor connected to the bit line BL1 is formed in the upper part shown in FIG. 23A. That is, the transistors shown in FIGS. 23A and 23B correspond to the n-type transistors M01 and M00, respectively, in the circuit diagram of FIG. 1, for example. In this embodiment, the n-type transistors M01 and M00 are each constituted by two transistors lying side by side in the X direction and connected in parallel. The broken line defines the bounds of the memory cell.

Figure 24:
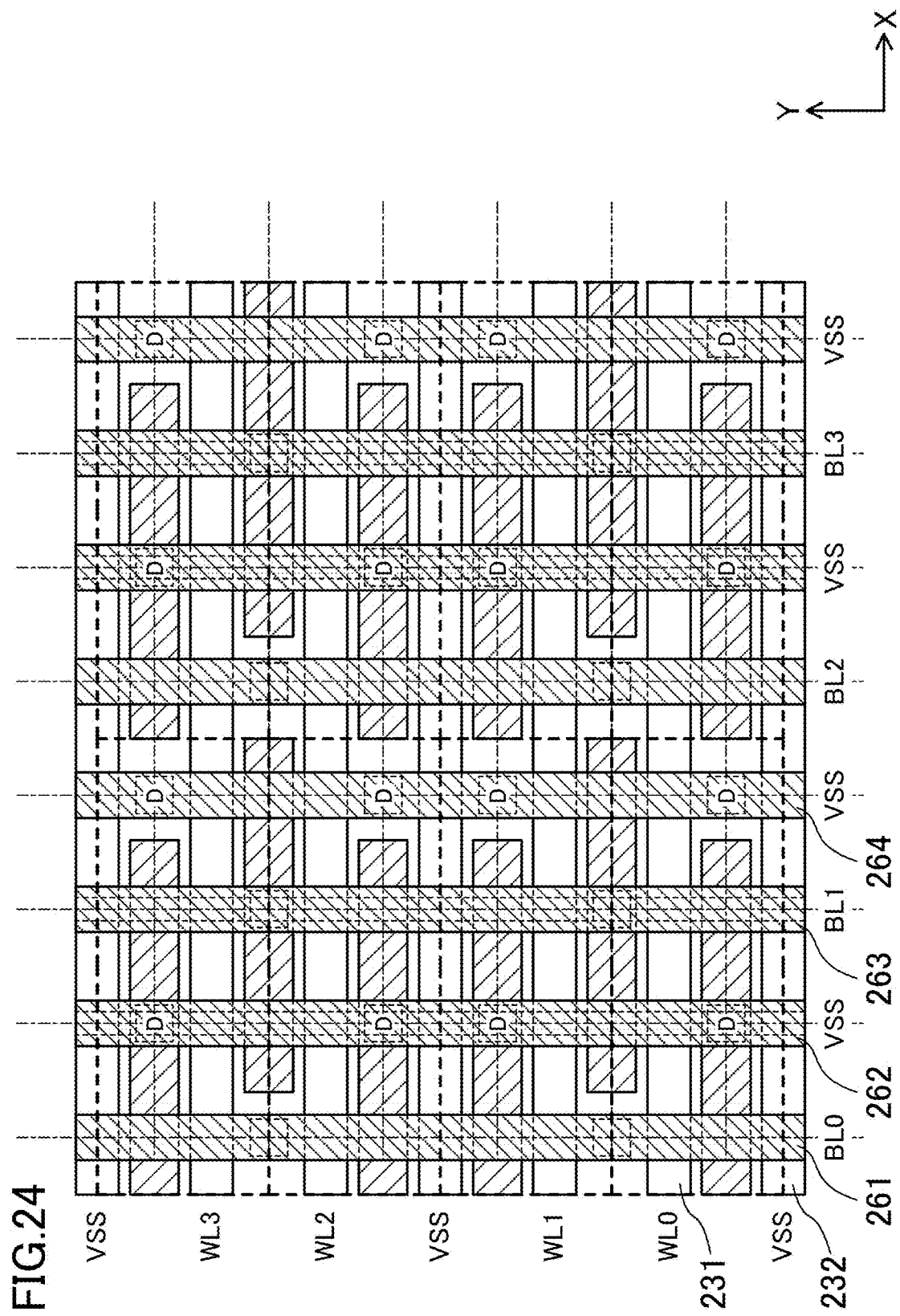
FIG. 24 shows a layout structure of an upper part of a memory cell array using the memory cell of FIGS. 23A-23B.
Figure 25:
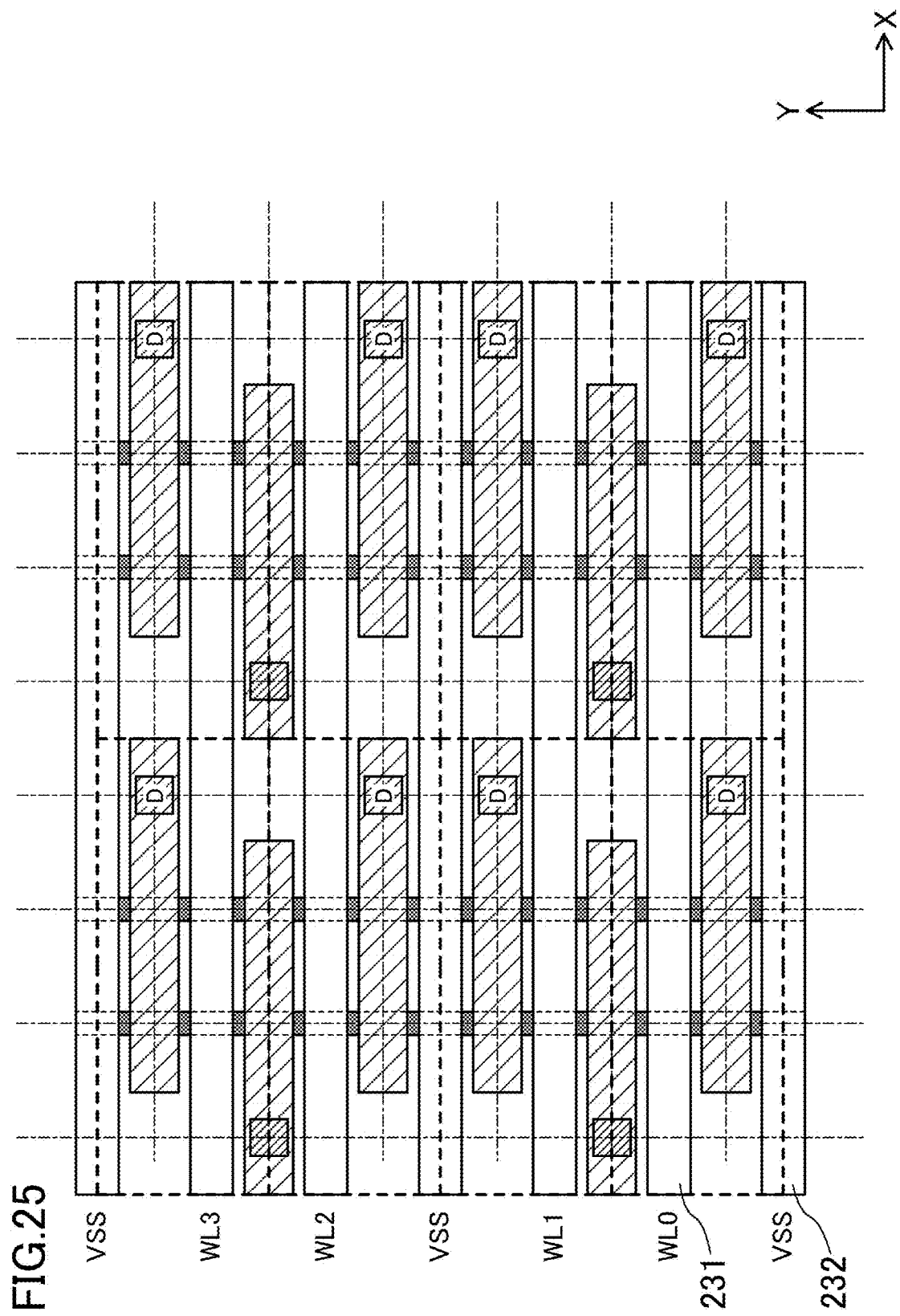
FIG. 25 shows a layout structure of a lower part of the memory cell array using the memory cell of FIGS. 23A-23B.

FIGS. 24 and 25 are views showing an layout structure of a memory cell array using the memory cell of FIGS. 23A-23B, where FIG. 24 shows the upper part and FIG. 25 shows the lower part.

As shown in FIG. 23A, interconnects 261, 262, 263, and 264 extending in the Y direction are formed in an M1 interconnect layer. The M1 interconnect 261 corresponds to the bit line BL0, the M1 interconnect 262 and 264 supply the power supply voltage VSS, and the M1 interconnect 263 corresponds to the bit line BL1.

Nanowires 221 and 223 extending in the Y direction are formed in the lower part of the memory cell, and nanowire 226 and 228 extending in the Y direction are formed in the upper part of the memory cell. The nanowires 221 and 226 overlap each other as viewed in plan, and the nanowires 223 and 228 overlap each other as viewed in plan. Pads 222a and 222b doped with an n-type semiconductor are formed at both ends of the nanowire 221, and pads 224a and 224b doped with an n-type semiconductor are formed at both ends of the nanowire 223. Pads 227a and 227b doped with an n-type semiconductor are formed at both ends of the nanowire 226, and pads 229a and 229b doped with an n-type semiconductor are formed at both ends of the nanowire 228. The nanowires 221 and 223 constitute the channel portion of the n-type transistor M00, and the pads 222a, 222b, 224a, and 224b constitute terminals that are to be the source or drain of the n-type transistor M00. The nanowires 226 and 228 constitute the channel portion of the n-type transistor M01, and the pads 227a, 227b, 229a, and 229b constitute terminals that are to be the source or drain of the n-type transistor M01. The n-type transistor M00 is formed above the buried interconnect layer in the Z direction, and the n-type transistor M01 is formed above the n-type transistor M00 in the Z direction.

A gate interconnect 231 extends in the X direction and also extends in the Z direction over the lower and upper parts of the memory cell. The gate interconnect 231 is to be the gates of the n-type transistors M00 and M01. That is, the n-type transistor M00 is constituted by the nanowires 221 and 223, the gate interconnect 231, and the pads 222a, 222b, 224a and 224b, and the n-type transistor M01 is constituted by the nanowires 226 and 228, the gate interconnect 231, and the pads 227a, 227b, 229a, and 229b. As will be described later, the gate interconnect 231 is connected to the word line WL0.

A dummy gate interconnect 232 is formed on the lower end of the memory cell in the figure. Like the gate interconnect 231, the dummy gate interconnect 232 extends in the X and Z directions. A nanowire 225a is formed to extend from the pad 222b downward in the figure, and a nanowire 225b is formed to extend from the pad 224b downward in the figure. A nanowire 225c is formed to extend from the pad 227b downward in the figure, and a nanowire 225d is formed to extend from the pad 229b downward in the figure. N-type transistors DN1 and DN2 are formed by the nanowires 225a and 225b and the dummy gate interconnect 232 and by the nanowires 225c and 225d and the dummy gate interconnect 232, respectively. Since the dummy gate interconnect 232 is connected to VSS (not shown), the n-type transistors DN1 and DN2 remain off, exerting no influence on the logical operation of the circuit.

In the lower part of the memory cell, local interconnects 241 and 242 extending in the X direction are formed. The local interconnect 241 is connected with the pads 222a and 224a and extends leftward from the pad 222a in the figure. The local interconnect 242 is connected with the pads 222b and 224b and extends rightward from the pad 224b in the figure. In the upper part of the memory cell, local interconnects 243 and 244 extending in the X direction are formed. The local interconnect 243 is connected with the pads 227a and 229a and extends rightward from the pad 229a in the figure. The local interconnect 244 is connected with the pads 227b and 229b and extends leftward from the pad 227b in the figure. The local interconnect 241 is connected with the M1 interconnect 261 through a contact 251, and the local interconnect 243 is connected with the M1 interconnect 263 through a contact 252.

Contacts 271 and 272 each determine the memory value of the memory cell by their presence or absence. The contact 271 connects the local interconnect 242 and the M1 interconnect 264 when it is formed, and the contact 272 connects the local interconnect 244 and the M1 interconnect 262 when it is formed.

FIGS. 24 and 25 show a configuration of an array of memory cells, two arranged in the X direction and four in the Y direction, using the memory cell of FIGS. 23A-23B. The memory cells are inverted in the Y direction every other row in the Y direction. The gate interconnects 231, shown in the memory cell of FIGS. 23A-23B, extend in line in the X direction, constituting the word lines WL0 to WL3. The dummy gate interconnects 232 are supplied with VSS. The M1 interconnects 261 to 264, shown in the memory cell of FIGS. 23A-23B, extend in line in the Y direction, constituting the lines for supplying the power supply voltage VSS and the bit lines BL0 to BL3. Between the word lines WL0 and WL1, the drains are shared by the adjacent transistors. Also, between the word lines WL2 and WL3, the drains are shared by the adjacent transistors.

As described above, according to this embodiment, the ROM cell includes the transistor M00 provided between the M1 interconnect 261 that is to be a bit line and the M1 interconnect 264 that supplies VSS and the transistor M01 provided between the M1 interconnect 263 that is to be a bit line and the M1 interconnect 262 that supplies VSS. The transistor M01 is formed above the transistor M00, and the channel portions of the transistors M00 and M01 overlap each other as viewed in plan. The transistors M00 and M01 each include two transistors lying side by side in the X direction and sharing the source and the drain. First data is stored in the ROM cell depending on the presence or absence of connection between the local interconnect 242 connected to the source shared by the two transistors of the transistor M00 and the M1 interconnect 264. Also, second data is stored in the ROM cell depending on the presence or absence of connection between the local interconnect 244 connected to the source shared by the two transistors of the transistor M01 and the M1 interconnect 262. In this way, a small-area layout structure of a mask ROM can be implemented.

While the transistor constituting the memory cell includes two parallel-connected transistors in the illustrated example, it may include three or more parallel-connected transistors.

(Other Layout Structure Examples)

Figure 26:
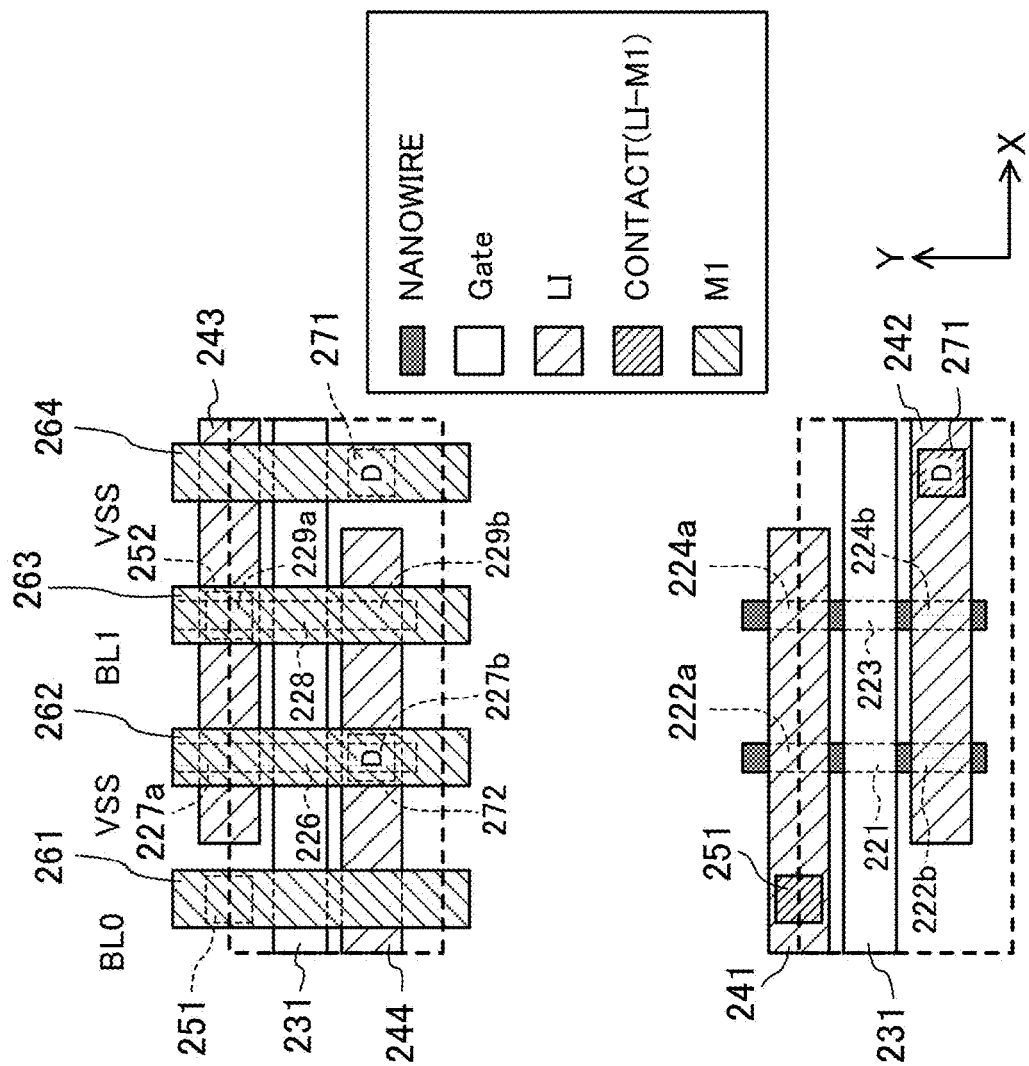
FIGS. 26A and 26B are plan views showing another example of the layout structure of the memory cell according to the third embodiment.
Figure 27:
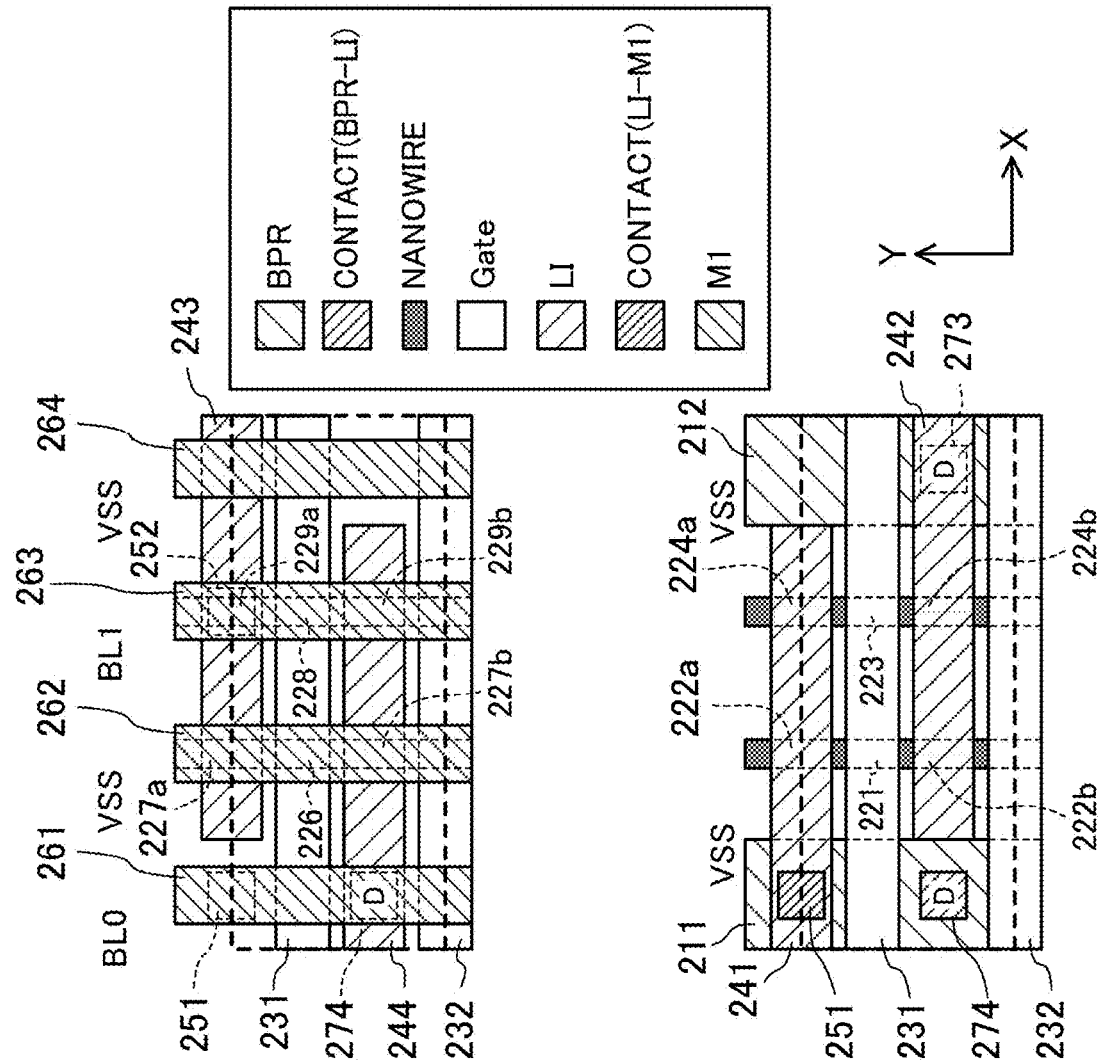
FIGS. 27A and 27B are plan views showing yet another example of the layout structure of the memory cell according to the third embodiment.
Figure 28:
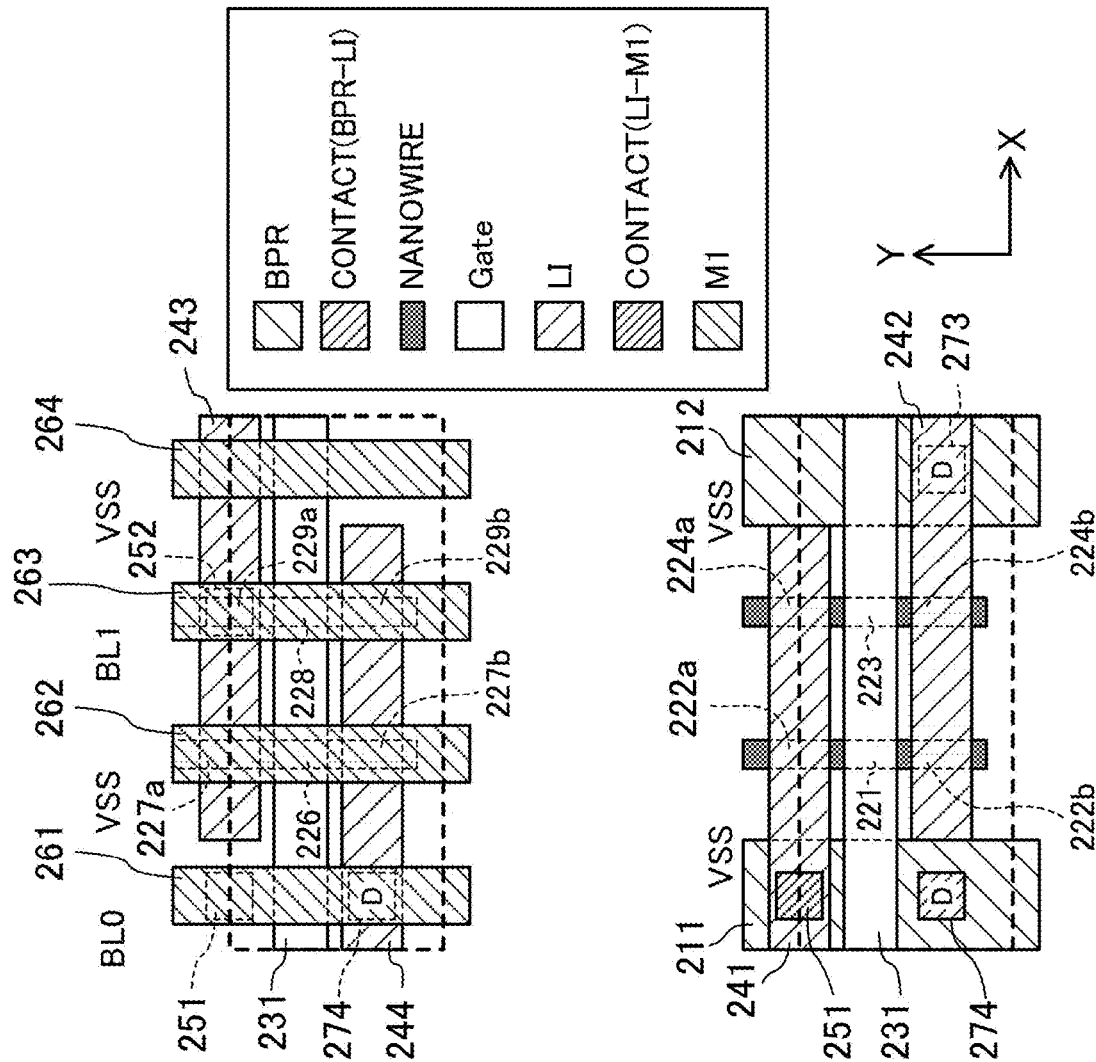
FIGS. 28A and 28B are plan views showing yet another example of the layout structure of the memory cell according to the third embodiment.

FIGS. 26A-26B to 28A-28B are plan views showing other examples of the layout structure of the memory cell according to this embodiment, where FIGS. 26A, 27A, and 28A show the upper part and FIGS. 26B, 27B, and 28B show the lower part. The layout structures of 26A-26B to 28A-28B are basically the same as that of FIGS. 23A-23B, except for the following points.

In the layout structure of FIGS. 26A-26B, the dummy gate interconnect 232 is not formed, nor are the n-type transistors DN1 and DN2 formed.

In the layout structure of FIGS. 27A-27B, power supply lines 211 and 212 extending in the Y direction are provided on both ends of the memory cell in the figure. The power supply lines 211 and 212 are BPRs formed in the buried interconnect layer and supply the power supply voltage VSS. Contacts 273 and 274, in place of the contacts 271 and 272, determine the memory value of the memory cell by their presence or absence. The contact 273 connects the local interconnect 242 and the power supply line 212 when it is formed, and the contact 274 connects the local interconnect 244 and the power supply line 211 when it is formed. The interconnects 262 and 264 are not connected with the memory cell, but function for reduction of crosstalk noise between bit lines.

In the layout structure of FIGS. 28A-28B, in comparison with the layout structure of FIGS. 27A-27B, the dummy gate interconnect 232 is not formed, nor are the n-type transistors DN1 and DN2 formed.

Fourth Embodiment

Figure 29:
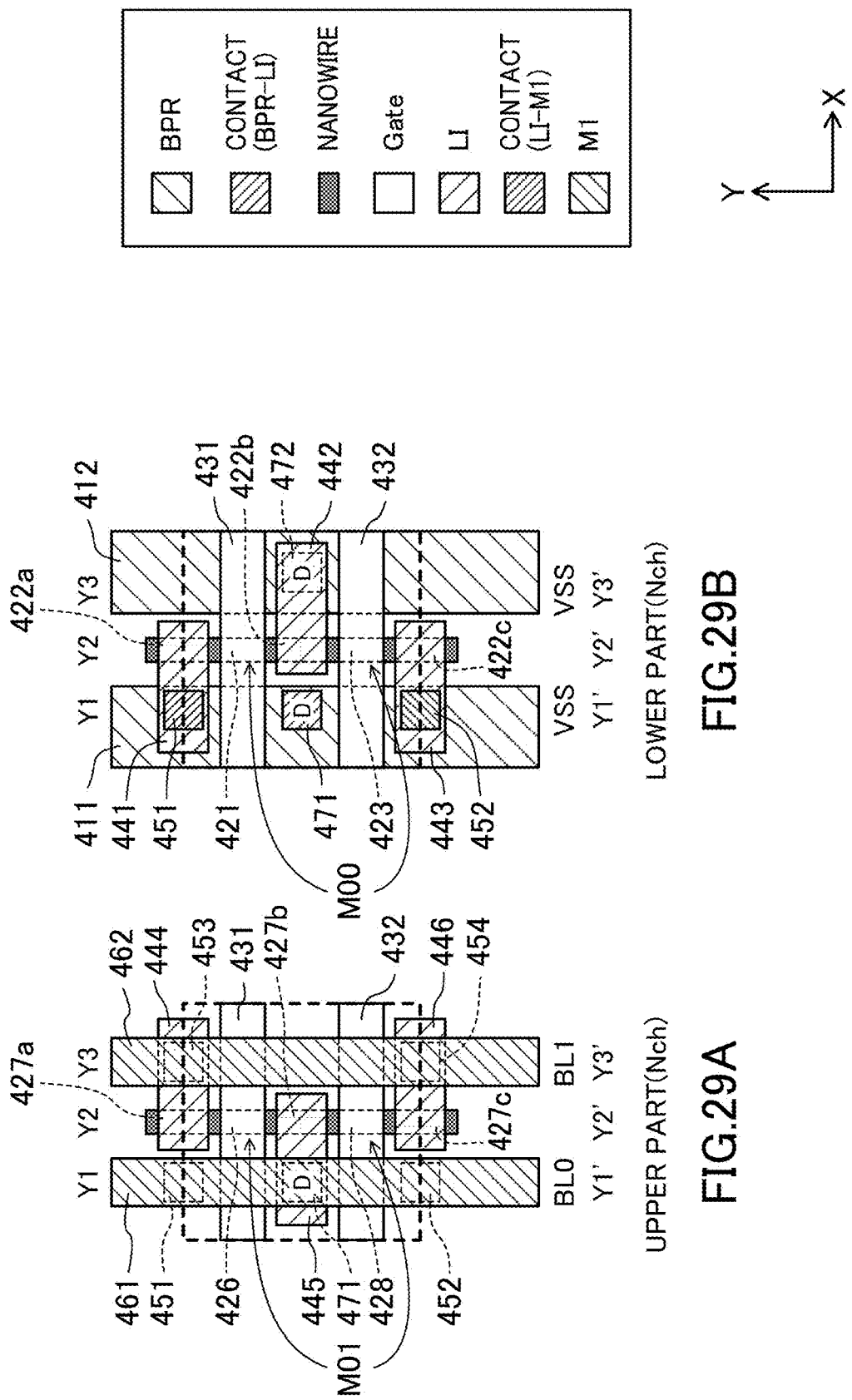
FIGS. 29A and 29B are plan views showing an example of a layout structure of a memory cell according to the fourth embodiment.
Figure 30:
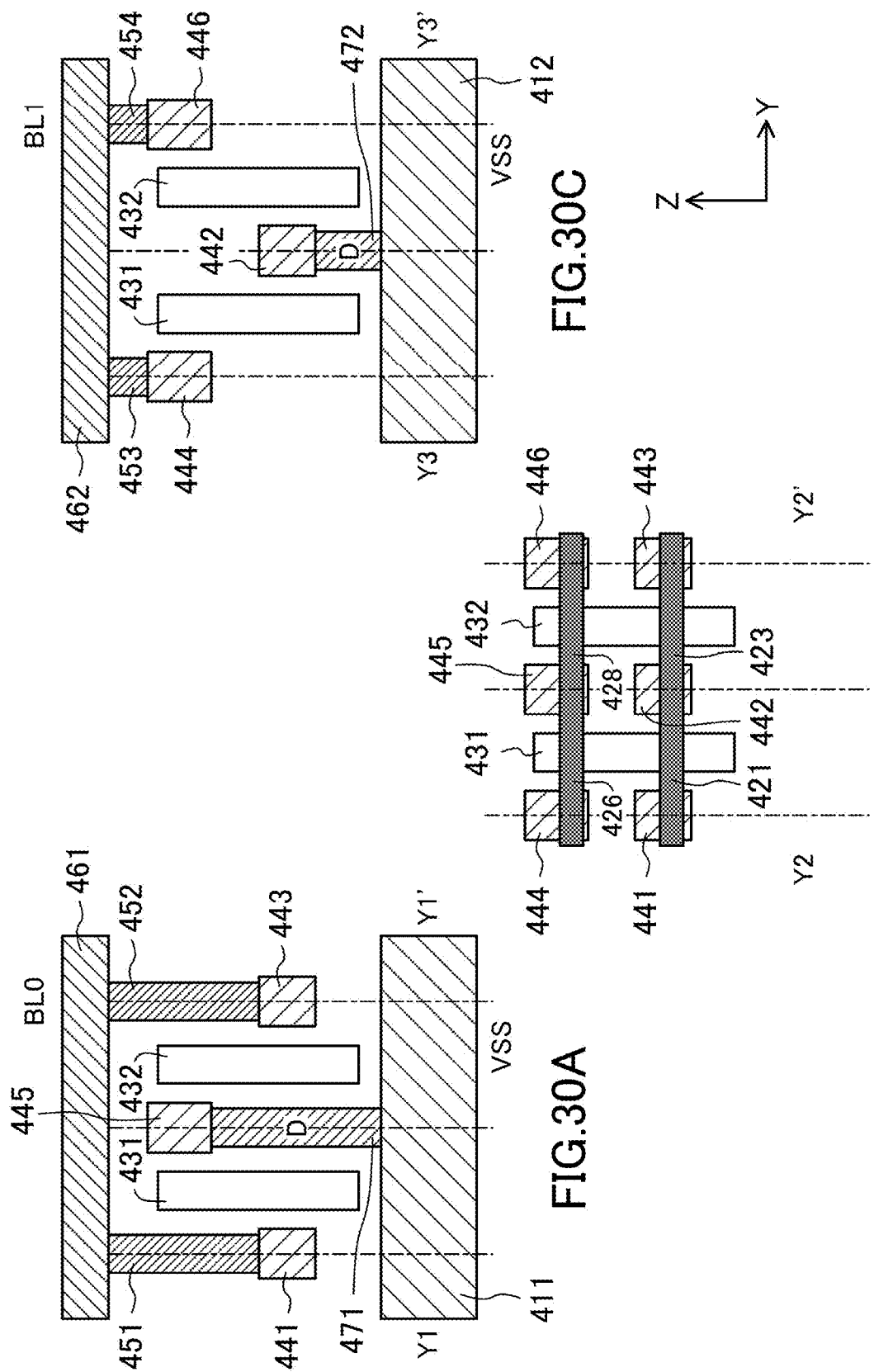
FIGS. 30A to 30C are cross-sectional views of the memory cell of FIGS. 29A-29B.

FIGS. 29A-29B and FIGS. 30A-30C are views showing an example of a layout structure of a mask ROM according to the fourth embodiment, where FIGS. 29A-29B are plan views of a memory cell, and FIGS. 30A-30C are cross-sectional views of the memory cell taken in the vertical direction as viewed in plan. Specifically, FIG. 29A shows an upper part and FIG. 29B shows a lower part. FIG. 30A shows a cross section taken along line Y1-Y1', FIG. 30B shows a cross section taken along line Y2-Y2', and FIG. 30C shows a cross section taken along line Y3-Y3'.

FIGS. 29A-29B and FIGS. 30A-30C correspond to a layout of two bits of memory cells lying side by side in the horizontal direction in the memory cell array 3 in FIG. 1. A transistor connected to the bit line BL0 is formed in the lower part shown in FIG. 29B, and a transistor connected to the bit line BL1 is formed in the upper part shown in FIG. 29A. That is, the transistors shown in FIGS. 29A and 29B correspond to the n-type transistors M01 and M00, respectively, in the circuit diagram of FIG. 1, for example. In this embodiment, the n-type transistors M01 and M00 are each constituted by two transistors lying side by side in the Y direction and connected in parallel. The broken line defines the bounds of the memory cell.

Figure 31:
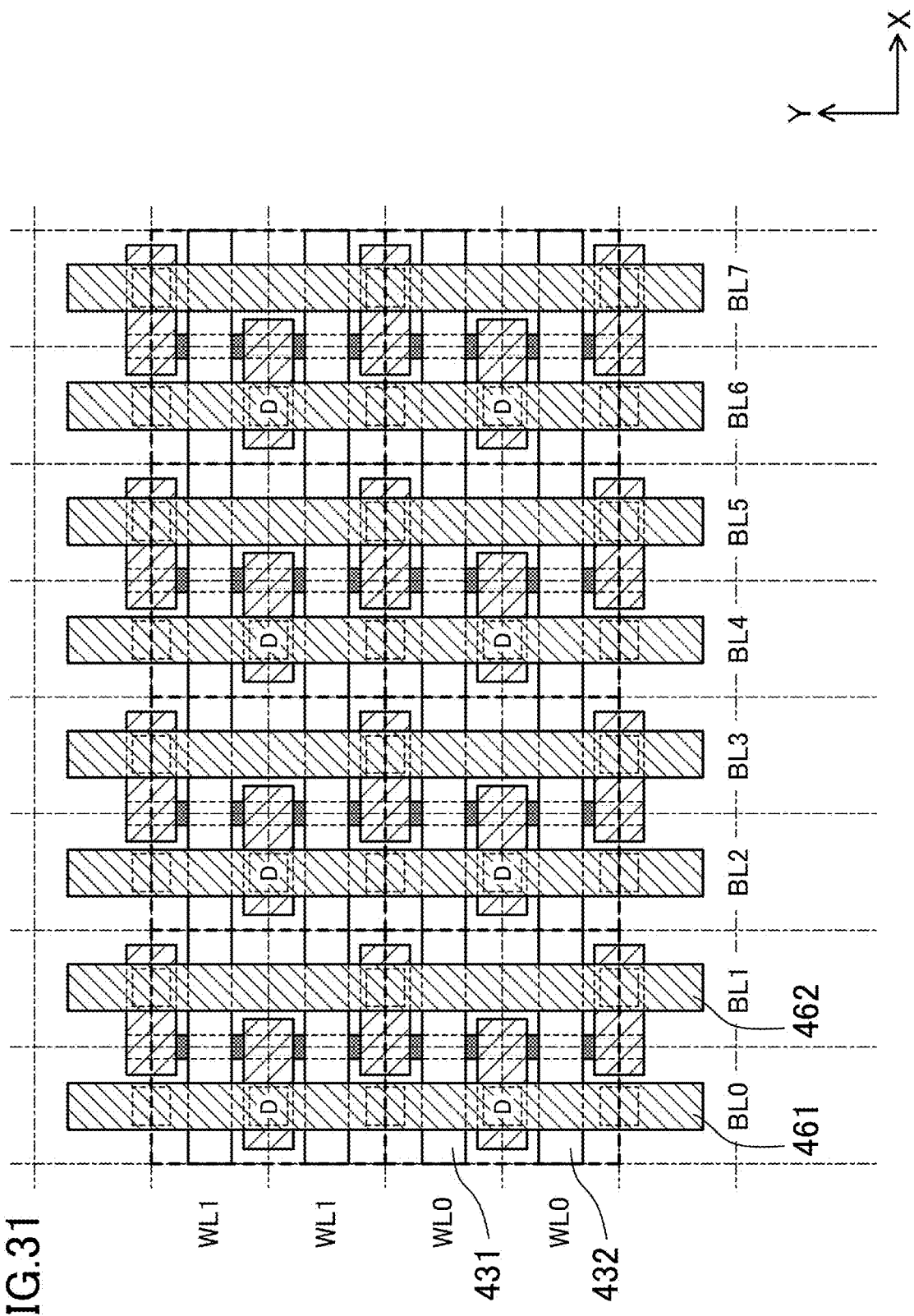
FIG. 31 shows a layout structure of an upper part of a memory cell array using the memory cell of FIGS. 29A-29B and 30A-30C.
Figure 32:
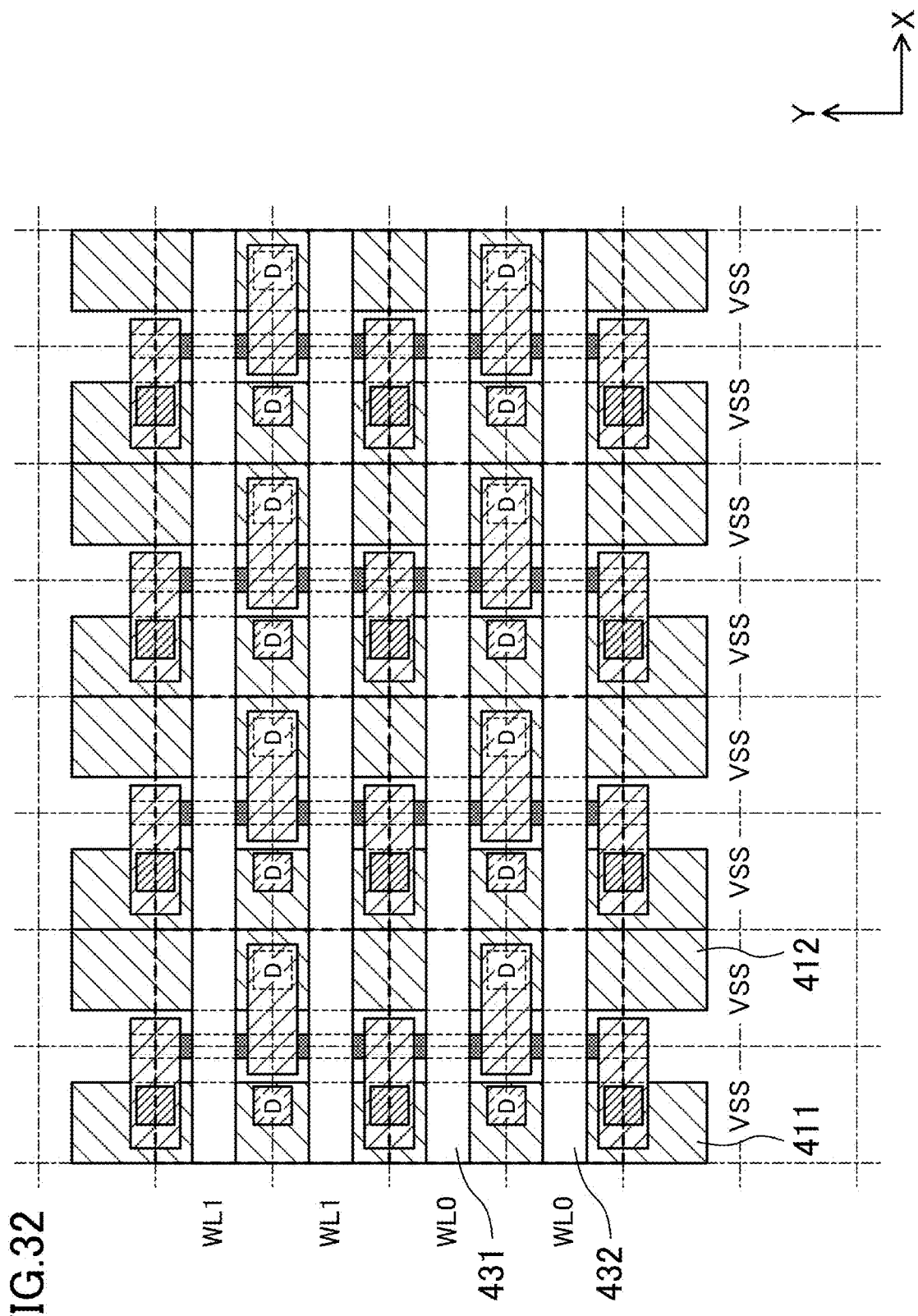
FIG. 32 shows a layout structure of a lower part of the memory cell array using the memory cell of FIGS. 29A-29B and 30A-30C.

FIGS. 31 and 32 are views showing an layout structure of a memory cell array using the memory cell of FIGS. 29A-29B, where FIG. 31 shows the upper part and FIG. 32 shows the lower part.

As shown in FIG. 29B, power supply lines 411 and 412 extending in the Y direction are provided on both ends of the memory cell in the X direction. The power supply lines 411 and 412 are both BPRs and supply the power supply voltage VSS.

As shown in FIG. 29A, interconnects 461 and 462 extending in the Y direction are formed in an M1 interconnect layer. The M1 interconnect 461 corresponds to the bit line BL0 and the M1 interconnect 462 corresponds to the bit line BL1.

Nanowires 421 and 423 extending in the Y direction are formed in the lower part of the memory cell, and nanowire 426 and 428 extending in the Y direction are formed in the upper part of the memory cell. The nanowires 421 and 426 overlap each other as viewed in plan, and the nanowires 423 and 428 overlap each other as viewed in plan. Pads 422a, 422b, and 422c doped with an n-type semiconductor are formed at the upper end of the nanowire 421, between the nanowires 421 and 423, and at the lower end of the nanowire 423 in the figure. Also, pads 427a, 427b, and 427c doped with an n-type semiconductor are formed at the upper end of the nanowire 426, between the nanowires 426 and 428, and at the lower end of the nanowire 428 in the figure.

The nanowires 421 and 423 constitute the channel portion of the n-type transistor M00, and the pads 422a, 422b, and 422c constitute terminals that are to be the source or drain of the n-type transistor M00. The pad 422b serves as the common source of the two transistors constituting the n-type transistor M00. The nanowires 426 and 428 constitute the channel portion of the n-type transistor M01, and the pads 427a, 427b, and 427c constitute terminals that are to be the source or drain of the n-type transistor M01. The pad 427b serves as the common source of the two transistors constituting the n-type transistor M01. The n-type transistor M00 is formed above the buried interconnect layer in the Z direction, and the n-type transistor M01 is formed above the n-type transistor M00 in the Z direction.

Gate interconnects 431 and 432 extend in parallel in the X direction and also extend in the Z direction over the lower and upper parts of the memory cell. The gate interconnects 431 and 432 are to be the gates of the n-type transistors M00 and M01. That is, the n-type transistor M00 is constituted by the nanowires 421 and 423, the gate interconnects 431 and 432, and the pads 422a, 422b, and 422c. Also, the n-type transistor M01 is constituted by the nanowires 426 and 428, the gate interconnects 431 and 432, and the pads 427a, 427b, and 427c. As will be described later, the gate interconnects 431 and 432 are connected to the same word line WL0.

In the lower part of the memory cell, local interconnects 441, 442, and 443 extending in the X direction are formed. The local interconnect 441 is connected with the pad 422a and extends leftward from the pad 422a in the figure. The local interconnect 442 is connected with the pad 422b and extends rightward from the pad 422b in the figure. The local interconnect 443 is connected with the pad 422c and extends leftward from the pad 422c in the figure. In the upper part of the memory cell, local interconnects 444, 445, and 446 extending in the X direction are formed. The local interconnect 444 is connected with the pad 427a and extends rightward from the pad 427a in the figure. The local interconnect 445 is connected with the pad 427b and extends leftward from the pad 427b in the figure. The local interconnect 446 is connected with the pad 427c and extends rightward from the pad 427c in the figure.

The local interconnect 441 is connected with the M1 interconnect 461 through a contact 451, and the local interconnect 443 is connected with the M1 interconnect 461 through a contact 452. The local interconnect 444 is connected with the M1 interconnect 462 through a contact 453, and the local interconnect 446 is connected with the M1 interconnect 462 through a contact 454.

Contacts 471 and 472 each determine the memory value of the memory cell by their presence or absence. The contact 471 connects the local interconnect 445 and the power supply line 411 when it is formed, and the contact 472 connects the local interconnect 442 and the power supply line 412 when it is formed.

FIGS. 31 and 32 show a configuration of an array of memory cells, four arranged in the X direction and two in the Y direction, using the memory cell of FIGS. 29A-29B. The gate interconnects 431 and 432, shown in the memory cell of FIGS. 29A-29B, extend in line in the X direction, constituting the word lines WL0 and WL1. The interconnects 461 and 462, shown in the memory cell of FIGS. 29A-29B, extend in line in the Y direction, constituting the bit lines BL0 to BL7. Between the word lines WL0 and WL1, the drains are shared by the adjacent transistors.

As described above, according to this embodiment, the ROM cell includes the transistor M00 provided between the M1 interconnect 461 that is to be a bit line and the power supply line 412 that supplies VSS and the transistor M01 provided between the M1 interconnect 462 that is to be a bit line and the power supply line 411 that supplies VSS. The transistor M01 is formed above the transistor M00, and the channel portions of the transistors M00 and M01 overlap each other as viewed in plan. The transistors M00 and M01 each include two transistors lying side by side in the Y direction and sharing the source. First data is stored in the ROM cell depending on the presence or absence of connection between the local interconnect 442 connected to the source as a first node shared by the two transistors of the transistor M00 and the power supply line 412. Also, second data is stored in the ROM cell depending on the presence or absence of connection between the local interconnect 445 connected to the source shared by the two transistors of the transistor M01 and the power supply line 411. In this way, a small-area layout structure of a mask ROM can be implemented.

(Other Layout Structure Example)

Figure 33:
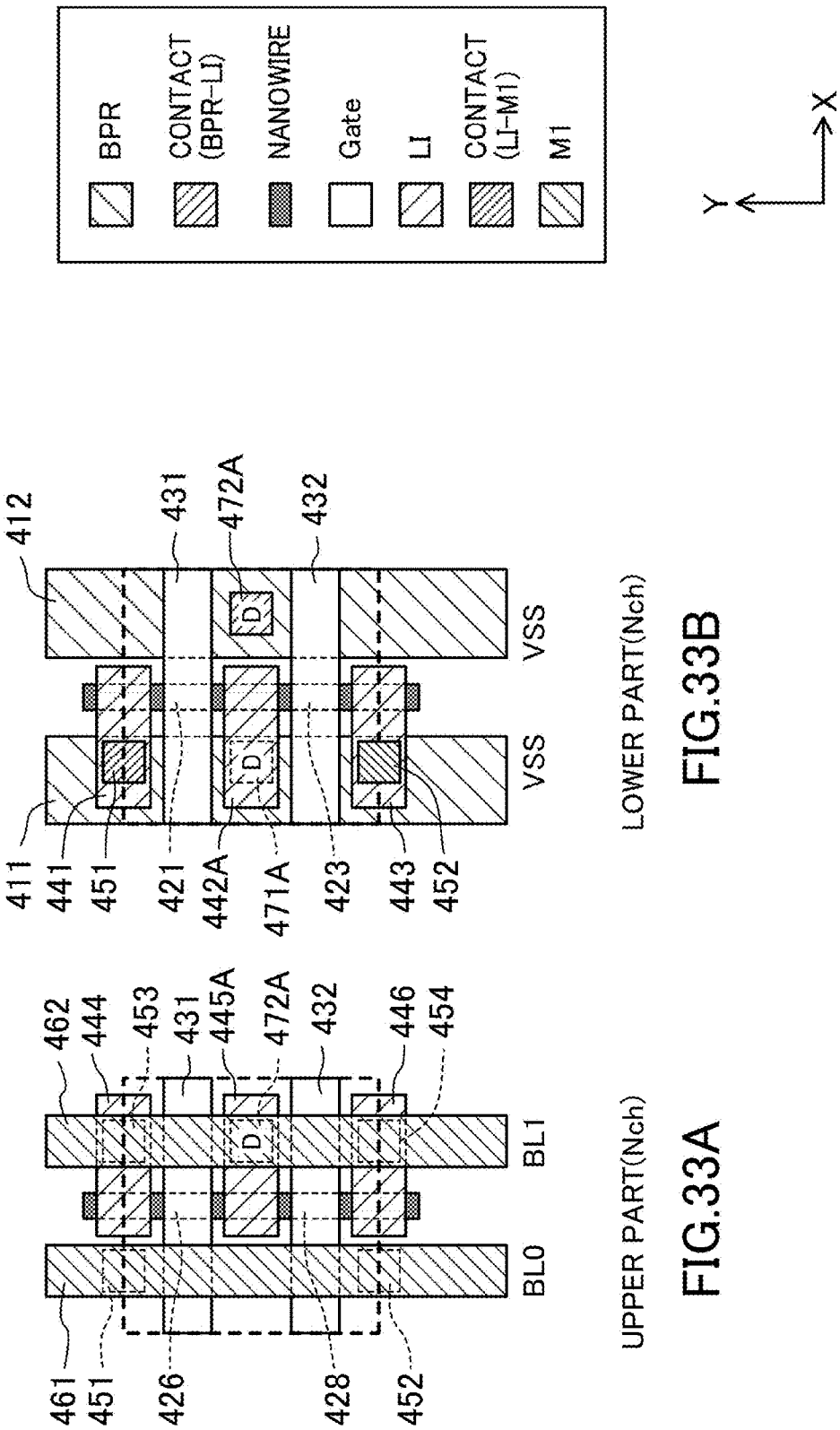
FIGS. 33A and 33B are plan views showing another example of the layout structure of the memory cell according to the fourth embodiment.

FIGS. 33A-33B are plan views showing another example of the layout structure of the memory cell according to this embodiment, where FIG. 33A shows the upper part and FIG. 33B shows the lower part. The layout structure of this example is basically the same as that of FIGS. 29A-29B, except for the following point.

In the layout structure of FIGS. 33A-33B, the local interconnects for the source and the drain extend from the same side of the transistor. In the lower transistor, all of the local interconnects 441, 442A, and 443 extend leftward in the figure, and the memory value is set depending on the presence or absence of a contact 471A between the local interconnect 442A and the power supply line 411. In the upper transistor, all of the local interconnects 444, 445A, and 446 extend rightward in the figure, and the memory value is set depending on the presence or absence of a contact 472A between the local interconnect 445A and the power supply line 412.

(Alteration of Fourth Embodiment)

The embodiment described above has a layout structure where the memory value of the memory cell is determined by the presence or absence of a contact between a local interconnect connected to the source of the transistor and the ground power supply line. On the contrary, in the layout structure of this alteration, the memory value of the memory cell is determined by the presence or absence of a contact between a local interconnect connected to the drain of the transistor and the bit line.

Figure 34:
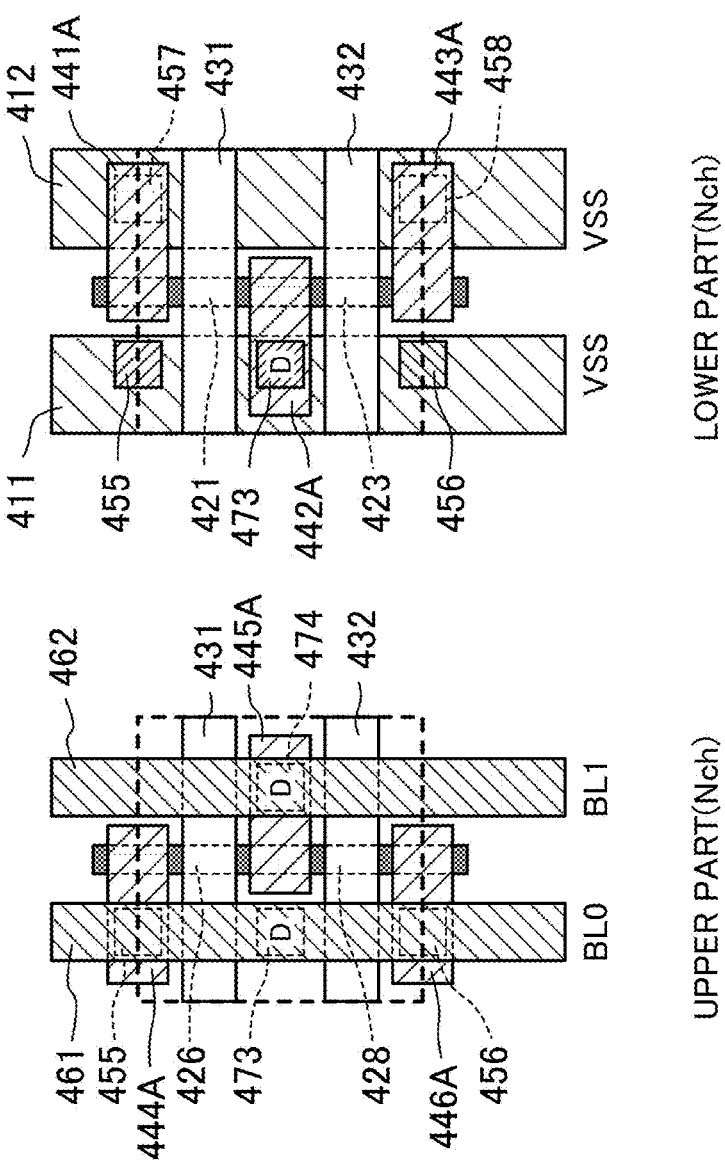
FIGS. 34A and 34B are plan views showing an example of a layout structure of a memory cell according to an alteration of the fourth embodiment.

FIGS. 34A-34B are plan views of a memory cell of this alteration, where FIG. 34A shows the upper part and FIG. 34B shows the lower part. In the layout structure of FIGS. 34A-34B, components in common with those in FIGS. 29A-29B are denoted by the same reference characters, and the description thereof is omitted here.

In the lower part of the memory cell, local interconnects 441A, 442A, and 443A extending in the X direction are formed. The local interconnect 441A is connected with the pad 422a and extends rightward from the pad 422a in the figure. The local interconnect 442A is connected with the pad 422b and extends leftward from the pad 422b in the figure. The local interconnect 443A is connected with the pad 422c and extends rightward from the pad 422c in the figure. In the upper part of the memory cell, local interconnects 444A, 445A, and 446A extending in the X direction are formed. The local interconnect 444A is connected with the pad 427a and extends leftward from the pad 427a in the figure. The local interconnect 445A is connected with the pad 427b and extends rightward from the pad 427b in the figure. The local interconnect 446A is connected with the pad 427c and extends leftward from the pad 427c in the figure.

The local interconnect 441A is connected with the power supply line 412 through a contact 457, and the local interconnect 443A is connected with the power supply line 412 through a contact 458. The local interconnect 444A is connected with the power supply line 411 through a contact 455, and the local interconnect 446A is connected with the power supply line 411 through a contact 456.

Contacts 473 and 474 each determine the memory value of the memory cell by their presence or absence. The contact 473 connects the local interconnect 442A and the M1 interconnect 461 when it is formed, and the contact 474 connects the local interconnect 445A and the M1 interconnect 462 when it is formed.

OTHER EXAMPLES

In the embodiments described above, while each transistor is assumed to have one nanowire, some or all transistors may have a plurality of nanowires. In this case, the plurality of nanowires may be arranged in the X direction as viewed in plan, or arranged in the Z direction. Alternatively, the plurality of nanowires may be arranged in both the X direction and the Z direction. The number of nanowires included in each transistor may be different between the upper and lower parts of the cell.

Also, in the above embodiments, while the cross-sectional shape of the nanowires is roughly square, it is not limited to this. For example, the shape may be circular or rectangular.

While the above embodiments have been described taking nanowire FETs as an example of three-dimensional transistors, the transistor type is not limited to this. For example, a fin transistor may be used as the transistor formed in the lower part of the cell.

According to the present disclosure, a small-area layout structure can be implemented for a semiconductor integrated circuit device provided with ROM cells using CFETs. The present disclosure is therefore useful for improvement of the performance of a semiconductor chip, for example.

What is claimed is:

1. A semiconductor storage device provided with a read only memory (ROM) cell, comprising:
    a word line extending in a first direction;
    a first bit line extending in a second direction perpendicular to the first direction; and
    a power supply line extending in the second direction,
    wherein
        the ROM cell includes
            a first transistor that is a nanowire FET formed above the power supply line,
            a second transistor that is a nanowire FET formed above the first transistor, channel portions of the first and second transistors overlapping each other as viewed in plan,
        gates of the first and second transistors are connected to the word line,
        one of the first and second transistors is provided between the first bit line and the power supply line, and
        first data is stored in the ROM cell depending on the presence or absence of connection between a source of the one of the first and second transistors and the power supply line or the presence or absence of connection between a drain of the one of the first and second transistors and the first bit line.

2. The semiconductor storage device of claim 1, wherein the first bit line is formed above the second transistor.

3. The semiconductor storage device of claim 1, further comprising:
    a second bit line extending in the second direction,
    wherein
        another of the first and second transistors is provided between the second bit line and the power supply line, and
        second data is stored in the ROM cell depending on the presence or absence of connection between a source of the another of the first and second transistors and the power supply line or the presence or absence of connection between a drain of the another of the first and second transistors and the second bit line.

4. The semiconductor storage device of claim 1, wherein the ROM cell includes a gate interconnect that extends in the first direction and also in a depth direction, is to be the gates of the first and second transistors, and is connected with the word line.

5. A semiconductor storage device provided with a read only memory (ROM) cell, comprising:
    a word line extending in a first direction;
    a bit line extending in a second direction perpendicular to the first direction; and
    a power supply line extending in the second direction,
    wherein
        the ROM cell includes
            a first transistor that is a nanowire FET,
            a second transistor that is a nanowire FET formed above the first transistor, channel portions of the first and second transistors overlapping each other as viewed in plan,
        gates of the first and second transistors are connected to the word line,
        the first and second transistors are provided between the bit line and the power supply line, and first data is stored in the ROM cell depending on the presence or absence of connection between a source of the first and second transistors and the power supply line or the presence or absence of connection between a drain of the first and second transistors and the bit line.

6. The semiconductor storage device of claim 5, wherein the bit line is formed above the second transistor.

7. The semiconductor storage device of claim 5, wherein the first transistor is formed above the power supply line.

8. The semiconductor storage device of claim 5, wherein the ROM cell includes a gate interconnect that extends in the first direction and also in a depth direction, is to be the gates of the first and second transistors, and is connected with the word line.

9. The semiconductor storage device of claim 5, wherein the power supply line is formed in a same layer as the bit line.

* * * * *